«12» United States Patent
Forbes

(10) Patent No.: US 7,262,428 B2
(45) Date of Patent: Aug. 28, 2007

(54) STRAINED SI/SIGE/SOI ISLANDS AND PROCESSES OF MAKING SAME

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/979,994

(22) Filed: Nov. 3, 2004

(65) Prior Publication Data
US 2005/0087842 A1  Apr. 28, 2005

Related U.S. Application Data

(62) Division of application No. 10/634,174, filed on Aug. 5, 2003, now Pat. No. 7,153,753.

(51) Int. Cl.
*H01L 31/109* (2006.01)
(52) U.S. Cl. .............. 257/19; 257/55; 257/63
(58) Field of Classification Search ......... 257/350, 257/353, 354
See application file for complete search history.

(56) References Cited

U.S. PATENT DOCUMENTS

| 3,953,839 | A | 4/1976 | Dennison et al. | |
|---|---|---|---|---|
| 4,241,359 | A | 12/1980 | Izumi et al. | 257/386 |
| 4,314,595 | A | 2/1982 | Yamamoto et al. | 148/1.5 |
| 4,589,928 | A | 5/1986 | Dalton | 438/142 |
| 4,631,234 | A | 12/1986 | Larrabee | |
| 4,717,681 | A | 1/1988 | Curran | 438/314 |
| 4,962,051 | A | 10/1990 | Liaw | |
| 5,234,535 | A | 8/1993 | Beyer et al. | 156/630 |
| 5,343,064 | A | 8/1994 | Spangler et al. | |
| 5,426,061 | A | 6/1995 | Sopori | 438/475 |
| 5,441,591 | A | 8/1995 | Imthurn et al. | 156/153 |
| 5,443,661 | A | 8/1995 | Oguro et al. | 148/33.5 |
| 5,461,243 | A | 10/1995 | Ek et al. | 257/190 |
| 5,482,869 | A | 1/1996 | Kohyama | |
| 5,487,999 | A | 1/1996 | Farnworth | 216/18 |
| 5,646,053 | A | 7/1997 | Schepis | 438/402 |
| 5,656,886 | A | 8/1997 | Westphal et al. | 313/495 |
| 5,661,044 | A | 8/1997 | Holland et al. | 438/766 |
| 5,679,475 | A | 10/1997 | Yamagata et al. | |
| 5,691,230 | A | 11/1997 | Forbes | 437/62 |

(Continued)

OTHER PUBLICATIONS

Ang, Kah W., "Enhanced performance in 50 nm N-MOSFETS with silicon-carbon source/drain regions", *IEEE International Electron Devices Meeting, 2004. IEDM Technical Digest.*, (Dec. 2004), 1069-1071.

(Continued)

*Primary Examiner*—Evan Pert
*Assistant Examiner*—Tan Tran
(74) *Attorney, Agent, or Firm*—Schwegman, Lundberg, Woessner & Kluth, P.A.

(57) ABSTRACT

A process of making a strained silicon-on-insulator structure is disclosed. A recess is formed in a substrate to laterally isolate an active area. An undercutting etch forms a bubble recess under the active area to partially vertically isolate the active area. A thermal oxidation completes the vertical isolation by use of a minifield oxidation process. The recess is filled to form a shallow trench isolation structure. An active device is also disclosed that is achieved by the process. A system is also disclosed that uses the active device.

7 Claims, 11 Drawing Sheets

U.S. PATENT DOCUMENTS

| | | |
|---|---|---|
| 5,735,949 A | 4/1998 | Mantl et al. |
| 5,759,898 A | 6/1998 | Ek et al. ................. 438/291 |
| 5,773,152 A | 6/1998 | Okonogi ................. 428/446 |
| 5,789,859 A | 8/1998 | Watkins et al. ............ 313/495 |
| 5,840,590 A | 11/1998 | Myers, Jr. et al. .......... 438/471 |
| 5,854,501 A | 12/1998 | Kao |
| 5,858,819 A | 1/1999 | Miyasaka |
| 5,877,070 A | 3/1999 | Goesele et al. |
| 5,879,996 A | 3/1999 | Forbes ................. 438/289 |
| 5,926,740 A | 7/1999 | Forbes et al. ............ 438/763 |
| 5,949,102 A | 9/1999 | Saida et al. ............. 257/315 |
| 5,963,817 A | 10/1999 | Chu et al. ............... 438/410 |
| 5,991,225 A | 11/1999 | Forbes et al. |
| 5,997,378 A | 12/1999 | Dynka et al. ............. 445/25 |
| 6,001,711 A | 12/1999 | Hashimoto ................ 438/473 |
| 6,022,793 A | 2/2000 | Wijaranakula et al. ..... 438/473 |
| 6,028,436 A | 2/2000 | Akram et al. ............. 324/755 |
| 6,049,106 A | 4/2000 | Forbes |
| 6,054,808 A | 4/2000 | Watkins et al. ............ 313/495 |
| 6,077,792 A | 6/2000 | Farrar ................. 438/780 |
| 6,083,324 A | 7/2000 | Henley et al. ............ 148/33.2 |
| 6,093,623 A | 7/2000 | Forbes ................. 438/455 |
| 6,093,624 A | 7/2000 | Letavic et al. ............ 438/462 |
| 6,096,433 A | 8/2000 | Kikuchi et al. ............ 428/446 |
| 6,103,598 A | 8/2000 | Yamagata et al. |
| 6,107,661 A | 8/2000 | Okabe et al. |
| 6,110,793 A | 8/2000 | Lee et al. ................. 438/400 |
| 6,127,777 A | 10/2000 | Watkins et al. ............ 313/554 |
| 6,136,666 A | 10/2000 | So ................. 438/458 |
| 6,143,628 A | 11/2000 | Sato et al. |
| 6,172,456 B1 | 1/2001 | Cathey et al. ............. 313/495 |
| 6,174,784 B1 | 1/2001 | Forbes ................. 438/405 |
| 6,175,242 B1 | 1/2001 | Akram et al. ............. 324/755 |
| 6,180,487 B1 | 1/2001 | Lin |
| 6,204,145 B1 | 3/2001 | Noble ................. 438/412 |
| 6,228,694 B1 | 5/2001 | Doyle et al. .............. 438/199 |
| 6,251,751 B1 | 6/2001 | Chu et al. ............... 438/439 |
| 6,261,876 B1 | 7/2001 | Crowder et al. ............ 438/149 |
| 6,274,457 B1 | 8/2001 | Sakai et al. ............... 438/424 |
| 6,274,460 B1 | 8/2001 | Delgado et al. ............ 438/476 |
| 6,309,907 B1 | 10/2001 | Forbes et al. ............. 438/108 |
| 6,309,950 B1 | 10/2001 | Forbes ................. 438/455 |
| 6,315,826 B1 | 11/2001 | Muramatsu ............... 117/95 |
| 6,328,620 B1 | 12/2001 | Hu ................. 445/50 |
| 6,338,805 B1 | 1/2002 | Anderson ................. 216/69 |
| 6,339,011 B1 | 1/2002 | Gonzalez et al. ........... 438/473 |
| 6,351,028 B1 | 2/2002 | Akram ................. 257/686 |
| 6,368,938 B1 | 4/2002 | Usenko ................. 438/407 |
| 6,376,336 B1 | 4/2002 | Buynoski ................ 438/476 |
| 6,377,070 B1 | 4/2002 | Forbes ................. 326/41 |
| 6,383,924 B1 | 5/2002 | Farrar et al. ............. 438/667 |
| 6,387,732 B1 | 5/2002 | Akram ................. 438/123 |
| 6,391,738 B2 | 5/2002 | Moore ................. 438/402 |
| 6,392,430 B1 | 5/2002 | Akram et al. ............. 324/755 |
| 6,413,827 B2 | 7/2002 | Farrar ................. 438/296 |
| 6,423,613 B1 | 7/2002 | Geusic ................. 438/455 |
| 6,424,001 B1 | 7/2002 | Forbes et al. ............. 257/315 |
| 6,444,534 B1 | 9/2002 | Maszara ................. 438/311 |
| 6,448,601 B1 | 9/2002 | Forbes et al. ............. 257/302 |
| 6,452,713 B1 | 9/2002 | White ................. 359/322 |
| 6,455,397 B1 | 9/2002 | Belford |
| 6,461,933 B2 | 10/2002 | Houston ................. 438/423 |
| 6,469,532 B2 | 10/2002 | Akram et al. ............. 324/755 |
| 6,476,434 B1 | 11/2002 | Noble et al. ............. 257/302 |
| 6,478,883 B1 | 11/2002 | Tamatsuka et al. ......... 148/33.2 |
| 6,486,008 B1 | 11/2002 | Lee |
| 6,489,183 B1 | 12/2002 | Farnworth ................. 438/112 |
| 6,496,034 B2 | 12/2002 | Forbes et al. ............. 326/41 |
| 6,514,836 B2 | 2/2003 | Belford |
| 6,515,335 B1 | 2/2003 | Christiansen et al. ....... 257/347 |
| 6,531,727 B2 | 3/2003 | Ahn et al. ............... 257/302 |
| 6,537,856 B2 | 3/2003 | Akram ................. 438/118 |
| 6,538,330 B1 | 3/2003 | Forbes ................. 257/777 |
| 6,541,356 B2 | 4/2003 | Fogel et al. ............. 438/480 |
| 6,542,682 B2 | 4/2003 | Cotteverte et al. ......... 385/125 |
| 6,559,491 B2 | 5/2003 | Forbes et al. ............. 257/296 |
| 6,566,682 B2 | 5/2003 | Forbes ................. 257/51 |
| 6,576,993 B2 | 6/2003 | Akram ................. 257/696 |
| 6,579,738 B2 | 6/2003 | Farrar et al. ............. 438/33 |
| 6,582,512 B2 | 6/2003 | Geusic et al. ............. 117/3 |
| 6,583,052 B2 | 6/2003 | Shin ................. 438/630 |
| 6,583,437 B2 | 6/2003 | Mizuno et al. ............. 257/19 |
| 6,593,625 B2 | 7/2003 | Christiansen et al. ....... 257/347 |
| 6,597,203 B2 | 7/2003 | Forbes ................. 326/98 |
| 6,624,006 B2 | 9/2003 | Akram ................. 438/118 |
| 6,630,713 B2 | 10/2003 | Geusic ................. 257/347 |
| 6,646,458 B2 | 11/2003 | Akram et al. ............. 324/755 |
| 6,649,476 B2 | 11/2003 | Forbes ................. 438/268 |
| 6,649,480 B2 * | 11/2003 | Fitzgerald et al. .......... 438/285 |
| 6,649,492 B2 | 11/2003 | Chu et al. |
| 6,656,782 B2 | 12/2003 | Skotnicki et al. .......... 438/221 |
| 6,689,671 B1 | 2/2004 | Yu et al. |
| 6,703,293 B2 | 3/2004 | Tweet et al. ............. 438/518 |
| 6,703,648 B1 | 3/2004 | Xiang et al. ............. 257/192 |
| 6,717,216 B1 | 4/2004 | Doris et al. |
| 6,812,508 B2 | 11/2004 | Fukumi |
| 6,825,102 B1 | 11/2004 | Bedell et al. |
| 6,855,649 B2 | 2/2005 | Christiansen et al. |
| 6,900,094 B2 * | 5/2005 | Hammond et al. ......... 438/238 |
| 6,902,616 B1 | 6/2005 | Yamazaki et al. |
| 6,929,984 B2 | 8/2005 | Forbes et al. |
| 6,963,078 B2 * | 11/2005 | Chu ................. 257/19 |
| 6,987,037 B2 | 1/2006 | Forbes |
| 7,008,854 B2 | 3/2006 | Forbes |
| 7,023,051 B2 | 4/2006 | Forbes |
| 7,041,575 B2 | 5/2006 | Forbes |
| 7,045,874 B2 | 5/2006 | Forbes |
| 7,084,429 B2 | 8/2006 | Forbes |
| 7,115,480 B2 | 10/2006 | Forbes |
| 2002/0001965 A1 | 1/2002 | Forbes ................. 438/734 |
| 2002/0048968 A1 | 4/2002 | Ahn ................. 438/778 |
| 2002/0062782 A1 | 5/2002 | Norris et al. ............. 117/3 |
| 2002/0070419 A1 | 6/2002 | Farrar et al. ............. 257/503 |
| 2002/0070421 A1 | 6/2002 | Ashburn ................. 257/510 |
| 2002/0076896 A1 | 6/2002 | Farrar et al. ............. 438/401 |
| 2002/0079557 A1 | 6/2002 | Ahn et al. ............... 257/632 |
| 2002/0135020 A1 | 9/2002 | Skotnicki et al. .......... 257/368 |
| 2002/0158322 A1 | 10/2002 | Farrar ................. 257/678 |
| 2002/0163044 A1 | 11/2002 | Farrar ................. 257/355 |
| 2002/0163045 A1 | 11/2002 | Farrar ................. 257/355 |
| 2002/0164859 A1 | 11/2002 | Farrar ................. 438/296 |
| 2002/0175330 A1 | 11/2002 | Geusic ................. 257/74 |
| 2002/0185686 A1 | 12/2002 | Christiansen et al. ....... 257/347 |
| 2003/0013323 A1 | 1/2003 | Hammond et al. ......... 438/981 |
| 2003/0027406 A1 | 2/2003 | Malone ................. 438/471 |
| 2003/0042627 A1 | 3/2003 | Farrar et al. ............. 257/503 |
| 2003/0133683 A1 | 7/2003 | Forbes |
| 2003/0157780 A1 | 8/2003 | Farrar et al. ............. 438/401 |
| 2003/0190796 A1 | 10/2003 | Geusic ................. 438/478 |
| 2003/0193088 A1 | 10/2003 | Hall ................. 257/713 |
| 2003/0197234 A1 | 10/2003 | Farrar ................. 257/424 |
| 2003/0201468 A1 | 10/2003 | Christiansen et al. ....... 257/200 |
| 2003/0218189 A1 | 11/2003 | Christiansen et al. ....... 257/200 |
| 2003/0221189 A1 | 11/2003 | Christiansen et al. |
| 2003/0227072 A1 | 12/2003 | Forbes ................. 257/616 |
| 2004/0171196 A1 | 9/2004 | Walitzki |
| 2004/0173798 A1 | 9/2004 | Forbes |
| 2004/0217352 A1 | 11/2004 | Forbes |
| 2004/0217391 A1 | 11/2004 | Forbes |
| 2004/0224480 A1 | 11/2004 | Forbes |
| 2004/0232422 A1 | 11/2004 | Forbes |
| 2004/0232487 A1 | 11/2004 | Forbes |
| 2004/0232488 A1 | 11/2004 | Forbes |
| 2004/0235264 A1 | 11/2004 | Forbes |

| | | |
|---|---|---|
| 2005/0017273 A1 | 1/2005 | Forbes et al. |
| 2005/0020094 A1 | 1/2005 | Forbes et al. |
| 2005/0023529 A1 | 2/2005 | Forbes |
| 2005/0023612 A1 | 2/2005 | Forbes |
| 2005/0023616 A1 | 2/2005 | Forbes |
| 2005/0029619 A1 | 2/2005 | Forbes |
| 2005/0029683 A1 | 2/2005 | Forbes et al. |
| 2005/0032296 A1 | 2/2005 | Forbes |
| 2005/0250274 A1 | 11/2005 | Forbes et al. |
| 2005/0285139 A1 | 12/2005 | Forbes |
| 2006/0001094 A1 | 1/2006 | Forbes |
| 2006/0011982 A1 | 1/2006 | Forbes |
| 2006/0097281 A1 | 5/2006 | Forbes |
| 2006/0208343 A1 | 9/2006 | Forbes |
| 2006/0244105 A1 | 11/2006 | Forbes et al. |

OTHER PUBLICATIONS

Forbes, K Y., "Non-Volatile Memory Device with Tensile Strained Silicon Layer", U.S. Appl. No. 11/260,339 (client ref No. 05-0753—Leffert file), 26 pgs.

Ghani, T., "A 90 nm High Volume Manufacturing Logic Technology Featuring Novel 45nm Gate Length Strained Silicon CMOS Transistors", *Technical Digest IEEE International Electron Devices Meeting*, (Dec. 2003),978-980.

Goto, K., "Technology Booster using Strain-Enhancing Laminated SiN (SELS) for 65nm Node Hp MPUs", *IEDM Technical Digest. IEEE International Electron Devices Meeting*, (Dec. 2004),209-212.

Irie, H., et al., "In-plane mobility anisotropy and universality under uni-axial strains in nand p-MOS inversion layers on (100), [110], and (111) Si", *IEEE International Electron Devices Meeting, 2004. IEDM Technical Digest.*, (Dec. 2004),225-228.

Komoda, T., "Mobility Improvement for 45nm Node by Combination of Optimized Stress Control and Channel Orientation Design", *IEEE International Electron Devices Meeting, 2004. IEDM Technical Digest.*, (Dec. 2004),217-220.

Maikap, S., "Package-strain-enhanced device and circuit performance", *IEEE International Electron Devices Meeting, 2004. IEDM Technical Digest.*, (Dec. 2004),233-236.

Pidin, S., "A Novel Strain Enhanced CMOS Architecture Using Selectively Deposited High Tensile and High Compressive Silicon Nitride Films", *IEEE International Electron Devices Meeting, 2004. IEDM Technical Digest.*, (Dec. 2004),213-216.

Thompson, S. E., "Key Differences For Process-induced Uniaxial vs. Substrate-induced Biaxial Stressed Si and Ge Channel MOSFETs", *IEEE International Electron Devices Meeting, 2004. IEDM Technical Digest.*, (Dec. 2004),221-224.

"Cornell Demonstrates a Universal Substrate", *Compound Semiconductor*, 3(2), (Mar./Apr. 1997),27-29.

Abe, T, "Silicon Wafer-Bonding Process Technology for SOI Structures", *Extended Abstracts of the 22nd (1990 International) Conference on Solid State Devices and Materials*, (1990),853-856.

Auberton-Herve, A J., "SOI: Materials to Systems", *International Electron Devices Meeting. Technical Digest*, (1996),3-10.

Autumn, Kellar, et al., "Adhesive force of a single gecko foot-hair", *Nature*, 405(6787), (Jun. 2000),681-685.

Autumn, Kellar, et al., "Evidence for van der Waals adhesion in gecko setae", *Proceedings of the National Academy of Science U S A.*; 99(19), (Sep. 17, 2002),12252-6.

Baginski, T. A., "Back-side germanium ion implantation gettering of silicon", *Journal of the Electrochemical Society*, 135(7), Dept of Electrical Engineering, Auburn Univ, AL,(Jul. 1988),1842-3.

Banhart, John, "Manufacture, characterisation and application of cellular metals and metal foams", *Progress in Materials Science*, vol. 46, Issue 6, (2001),559-632.

Banhart, John, "On the road again: metal foams find favor", *Physics Today*, 55(7), (Jul. 2002),37-42.

Belford, Rona E., et al., "Performance-Augmented CMOS Using Back-End Uniaxial Strain", *IEEE 60th DRC. Conference Digest Device Research Conference*, 2002, (Jun. 24-26, 2002),41-42.

Berti, M., "Composition and Structure of Si-Ge Layers Produced by Ion Implantation and Laser Melting", *Journal of Materials Research*, 6(10), (Oct. 1991),2120-2126.

Berti, M., "Laser Induced Epitaxial Regrowth of $Si_{1-x}Ge_x$/Si Layers Produced by Ge Ion Implantation", *Applied Surface Science*, 43, (1989), 158-164.

Bialas, F., et al., "Intrinsic Gettering of 300 mm CZ Wafers", *Microelectronic Engineering*, 56(1-2), (May 2001), 157-63.

Biever, Celeste, "Secret of 'strained silicon' revealed: behind closed doors, Intel has perfected a novel way to improve chip performance.", *New Scientist*, 180(i2426-2428), (Dec. 20, 2003),27.

Binns, M. J., et al., "The Realization of Uniform and Reliable Intrinsic Gettering in 200mm P-& P/P Wafers for a Low Thermal Budget 0.18 mu m Advanced CMOS Logic Process", *Diffusion and Defect Data Pt.B: Solid State Phenomena*, 82-84, (2001),387-92.

Birner, A, "Macroporous silicon: a two-dimensional photonic bandgap material suitable for the near-infrared spectral range", *Physica Status Solidi A*; 165, (Jan. 16, 1998),111-117.

Birner, A., "Silicon-Based Photonic Crystals", *Advanced Materials*, 13(6), (Mar. 2001),377-388.

Blanco, A, "Large-scale synthesis of a silicon photonic crystal with a complete three-dimensional bandgap near 1.5 micrometres", *Nature*, 405(6785), (May 25, 2000),437-40.

Blanford, C F., "Gems of Chemistry and Physics: Macroporous Metal Oxides with 3D Order", *Advanced Materials*, 13(6), (Mar. 2001).

Brequel, H, "Structural characterization and crystallization behaviour of silicon oxycarbide glasses", *XIX International Congress on Glass*, Proceedings of the Congress held at the Edinburgh International Conference Centre, Scotland, Jul. 1-6, 2001. Contains invited papers volume and extended abstracts of all the papers and posters presented during the Congress.,(2001).

Bronner, G. B., et al., "Physical Modeling of Backside Gettering", *Impurity Diffusion and Gettering in Silicon Symposium*, Sponsor: Mater. Res. Soc, Nov. 1984, Boston, MA(1985),27-30.

Brown, Chappell, "Bonding twists hints at universal substrate", *EETimes*, (1997),2 pages.

Bruel, M, "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Cartagena, E, et al., "Bonded Etchback Silicon on Sapphire Bipolar Junction Transistors", *Extended Abstracts—Electrochemical Society* (1), Program and Abstracts: 183rd Meeting of the Electrochemical Society, Pennington, NJ,(1993), 191.

Chen, Xiangdong, et al., "Vertical P-MOSFETs with heterojunction between source/drain and channel", *IEEE Device Research Conference*, (2000),25-26.

Chilton, B T., et al., "Solid phase epitaxial regrowth of strained $Si_{1-x}Ge_x$/Si strained layer structures amorphized by ion implantation", *Applied Physics Letters*, 54(1), (Jan. 2, 1989),42-44.

Choe, K. S., et al., "Minority-Carrier Lifetime Optimization in Silicon MOS Devices by Intrinsic Gettering", *Journal of Crystal Growth*, 218(2-4), (Sep. 2000),239-44.

Clark, Don, et al., "Intel unveils tiny new transistors: Process handles circuits 1/2000th the width of a human hair", *The Wall Street Journal*, (Aug. 13, 2002),3 pages.

Clifton, P A., et al., "A process for strained silicon n-channel HMOSFETs", *ESSDERC'96. Proceedings of the 26th European Solid State Device Research Conference*, (Sep. 1996),519-22.

Dharmatilleke, S N., et al., "Anodic Bonding of Glass to Glass and Silicon to Glass or Silicon to Silicon Through a Very Thick Thermally Grown $SiO_2$ Layer", *Proceedings of IS 3M International Symposium on Smart Structures and Microsystems*, http://dolphin.eng.uc.edu/projects/bonding/paper.pdf,(2000),32.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Fischetti, M V., et al., "Band structure, deformation potentials, and carrier mobility in strained Si, Ge, and SiGe alloys", *Journal of Applied Physics*, 80(4), (Aug. 15, 1996),2234-2252.

Fournel, F., et al., "Ultra High Precision Of The Tilt/Twist Misorientation Angles In Silicon/Silicon Direct Wafer Bonding", *Abstract—Electronic Materials Conference*, (Jun. 2002),9.

Garcia, G A., et al., "High-quality CMOS in thin (100 nm) silicon on sapphire", *IEEE Electron Device Letters*, 9(1), (Jan. 1988),32-34.

Godbole, H., et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989),201-3.

Gong, S. S., et al., "Implantation Gettering in Silicon", *Solid-State Electronics*, 30(2), (Feb. 1987),209-11.

Graf, D., et al., "300 mm epi pp- wafer: is there sufficient gettering?", *High Purity Silicon VI. Proceedings of the Sixth International Symposium* (Electrochemical Society Proceedings vol. 2000-17) (SPIE vol. 4218), (2000),319-30.

Haddad, H., et al., "Carbon Doping Effects on Hot Electron Trapping", *28th Annual Proceedings. Reliability Physics 1990*, (Mar. 1990),288-9.

Haddad, H., et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Harendt, Christine, "Silicon on Insulator Material by Wafer Bonding", *Journal of Electronic Materials*, 20(3), (Mar. 1991),267-77.

Ho, K, "Existence of a photonic gap in periodic dielectric structures", *Physical Review Letters*, 65(25), (Dec. 17, 1990),3152-3155.

Holland, Brian T., "Synthesis of Macroporous Mineral with Highly Ordered Three-Dimensional Arrays of Spheroidal Voids", *Science*, 281, (Jul. 24, 1998),538-540.

Imthurn, George P., et al., "Bonded Silicon-on-Sapphire Wafers and Devices", *Journal of Applied Physics*, 72(6), (Sep. 1992),2526-7.

Iyer, S S., "Separation by Plasma Implantation of Oxygen (SPIMOX) operational phase space", *IEEE trans. on Plasma Science*, 25, (1997), 1128-1135.

Jiang, P, "The Fabrication and Bandgap Engineering of Photonic Multilayers", *Advanced Materials*, 13(6), (Mar. 2001),389-393.

Joannopoulos, J D., "Photonic crystals : molding the flow of light", Princeton, N.J. : *Princeton University Press*, (1995),6.

John, S, "Photonic bandgap formation and tunability in certain self-organizing systems", *Journal of Lightwave Technology*, 17(11), (Nov. 1999), 1931-1943.

Johnson, S G., "Guided modes in photonic crystal slabs", *Physical Review B (Condensed Matter)*, 60(8), (Aug. 15, 1999),5751-8.

Jurczak, M, "SON (silicon on nothing)-a new device architecture for the ULSI era", *VLSI Technology, 1999. Digest of Technical Papers. 1999 Symposium on Jun. 14-16, 1999*, (Jun. 1999),29-30.

Kang, J. S., et al., "Gettering in Silicon", *Journal of Applied Physics*, 65(8), Center for Solid State Electron Res., Arizona State Univ., Tempe, AZ,(Apr. 15, 1989),2974-85.

Kostrzewa, M, et al., "Testing the Feasibility of strain relaxed InAsP and InGaAs compliant substrates", *EMC 2003 International Conference Indium Phosphide and Related Materials. Conference Proceedings*, (Jun. 2003),8.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA,(Dec. 1983), 1437-41.

Lasky, J. B., "Wafer Bonding for Silicon-on-Insulator Technologies", *Applied Physics Letters*, 48(1), (Jan. 6, 1986), 78-80.

Li, Y. X., et al., "New intrinsic gettering process in Czochralski-silicon wafer", *6th International Conference on Solid-State and Integrated Circuit Technology. Proceedings.* 1(1), (2001),277-9.

Li, Z Y., "Photonic Bandgaps in Disordered Inverse-Opal Photonic Crystals", *Advanced Materials*, 13(6), (Mar. 2001),433-436.

Lin, Shawn Yu, " A Three-dimensional optical photonic crystal", *Journal of Lightwave Technology*, 17(11), (Nov. 1999), 1944-1947.

Loncar, M, "Waveguiding in planar photonic crystals", *Applied Physics Letters*, 77(13), (Sep. 25, 2000), 1937-1939.

Loo, Y L., et al., "Contact Printing With Nanometer Resolution", *Device Research Conference*, (Jun. 2002), 149-150.

Lu, D,, "Bonding Silicon Wafers by Use of Electrostatic Fields Followed by Rapid Thermal Heating", *Materials Letters*, 4(11), (Oct. 1986), 461-464.

Lu, X., et al., "SiGe and SiGeC Surface Alloy Formation Using High-Dose Implantation and Solid Phase Epitaxy", *Proceedings of the 11th International Conference on Ion Implantation Technology*, Austin, TX,(1997),686-689.

Lu, Y, "Three-Dimensional Photonic Crystals with Non-spherical Colloids as Building Blocks", *Advanced Materials*, 13(6), (Mar. 2001),415-420.

Manoharan, V N., "Photonic Crystals from Emulsion Templates", *Advanced Materials*, 13(6), (Mar. 2001),447-450.

Meyerson, B S., "SiGe-Channel Heterojunction p-MOSFET's", *IEEE Transactions on Electron Devices*, 41(1), Authors: Verdonckt-Vandebroek, S.; Crabbe, E.F.; Meyerson, B.S.; Harame, D.L.; Restle, P.J.; Stork, J.M.C.; Johnson, J.B,(Jan. 1994),90-101.

Miguez, H, "Synthesis and Photonic Bandgap Characterization of Polymer Inverse Opals", *Advanced Materials*, 13(6), (Mar. 2001),393-396.

Mitsutake, K, "Theoretical Study on the Formation Process of Empty Space in Silicon (ESS)", *2000 International Conference on Solid State Devices and Materials*, (2000), 198-199.

Mizuno, T, et al., "Advanced SOI-MOSFETs with Strained-Si Channel for High Speed CMOS Electron/Hole Mobility Enhancement", *2000 Symposium on VLSI Technology. Digest of Technical Papers*, (2000),210-211.

Mizushima, I., "Empty-space-in-silicon technique for fabricating a silicon-on-nothing structure", *Applied Physics Letters*, 77(20), American Institute of Physics, NY,(Nov. 13, 2000),3290-3292.

Moran, Peter, "Strain Relaxation in Wafer-Bonded SiGe/Si Heterostructures Due to Viscous Flow of an Underlying Borosilicate Glass", *Electronic Materials Conference*, Santa Barbara, Jun. 2002, Abstract,(Jun. 2002),pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995),28-32.

Nayak, D. K., "High performance GeSi quantum-well PMOS on SIMOX", *International Electron Devices Meeting 1992. Technical Digest*, (1992),777-780.

Nichols, F. A., et al., "Surface- (interface-) and volume-diffusion contributions to morphological changes driven by capillarity", *Transactions of the American Institute of Mining, Metallurgical and Petroleum Engineers*, 233(10), (1965),1840-8.

Norris, D J., "Chemical Approaches to Three-Dimensional Semiconductor Photonic Crystals", *Advanced Materials*, 13(6), (Mar. 2001),371-376.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo, et al., "Semiconductor Surface with Strain Control", http://www.brl.ntt.co.jp/J/kouhou/katsudou/report00/E/report04_e.html.

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991),596-8.

Ouyang, Q, et al., "Bandgap Engineering in Deep Submicron Vertical pMOSFETs", *IEEE 58th DRC. Device Research Conference. Conference Digest*, (2000),27-28.

Paine, D. C., et al., "The Growth of Strained $Si_{1-x}Ge_x$ Alloys on (100) Silicon Using Solid Phase Epitaxy", *Journal of Materials Research*, 5(5), (May 1990), 1023-1031.

People, R., "Calculation of critical layer thickness versus lattice mismatch for $Ge_x Si_{1-x}$/Si strained-layer heterostructures", *Applied Physics Letters*, 47(3), (Aug. 1, 1985),322-324.

Reinhold Publishing Co., "Comparisons of Materials: Coefficient of Thermal Expansion", *Reprinted with permission from "Materials Selector", Reinhold Publishing Co., Penton/IPC*. http://www.handyharmancanada.com/TheBrazingBook/comparis.htm.

Renlund, G., "Silicon oxycarbide glasses: Part II. Structure and properties", *Journal of Materials Research*, 6(12), (Dec. 1991),2723-2734.

Rim, Kern, et al., "Fabrication and analysis of deep submicron strained-Si n-MOSFET's", *IEEE Transactions on Electron Devices*, 47(7), (Jul. 2000), 1406-1415.

Rim, Kern, et al., "Strained Si NMOSFETs for High Performance CMOS Technology", *2001 Symposium on VLSI Technology. Digest of Technical Papers*, (2001),59-60.

Rim, Kern, et al., "Transconductance enhancement in deep submicron strained Si n-MOSFETs", *International Electron Devices Meeting 1998. Technical Digest*, (1998),707-710.

Rubin, L, et al., "Effective gettering of oxygen by high dose, high energy boron buried layers", *1998 International Conference on Ion Implantation Technology. Proceedings*, 2(2), (1998), 1010-13.

Sato, Tsutomu, "A New Substrate Engineering for the Formation of Empty Space in Silicon (ESS) Induced by Silicon Surface Migration", *IEDM Digest,* paper 20.6.1, (1999),20.6.1-20.6.4.

Sato, T, "Trench transformation technology using hydrogen annealing for realizing highly reliable device structure with thin dielectric films", *1998 Symposium on VLSI Technology Digest of Technical Papers*, (1998),206-7.

Smith, C J., "Low-loss channel waveguides with two-dimensional photonic crystal boundaries", *Applied Physics Letters*, 77(18), (Oct. 30, 2000),2813-2815.

Subramania, G, *Advanced Materials*, 13(6), Inverse Face-Centered Cubic Thin Film Photonic Crystals,(Mar. 2001),443-446.

Sugiyama, N, et al., "Formation of strained-silicon layer on thin relaxed-SiGe/$SiO_2$/Si structure using SIMOX technology", *Thin Solid Films*, 369(1-2), (Jul. 2000), 199-202.

Suni, T, et al., "Effects of Plasma Activation on Hydrophilic Bonding of Si and SiO2", *Journal of the Electrochemical Society*, 149, (2002),G348-51.

Suyal, N, et al., "A solid state 29Si and 13C NMR study on the synthesis of thin silicon-oxycarbide glass sheets by a sol-gel route", *Journal of Materials Chemistry*, 9(12), (1999),3061-3067.

Suyal, N, et al., "Microstructural and Dielectric Characterization of Sol-Gel Derived Silicon Oxycarbide Glass Sheets", *Journal of Sol-Gel Science and Technology*, 14 (1), (1999), 113-123.

Suyal, N, et al., "Sol-gel synthesis & microstructural characterization of silicon oxycarbide glass sheets with high fracture strength and high modulus", *Journal of Sol-Gel Science & Technology*, (1998),995-999.

Sze, S. M., "Physics of Semiconductor Devices", *New York, Wiley-Interscience*, ISBN: 0471842907,(1969),402-407.

Takagi, Shin-Ichi, "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002),37-40.

Tan, T. Y., et al., "Intrinsic gettering by oxide precipitate induced dislocations in Czochralski Si", *Applied Physics Letters*, 30(4), (Feb. 15, 1977), 175-6.

Tessier, P M., "Structured Metallic Films for Optical and Spectroscopic Applications via Colloidal Crystal Templating", *Advanced Materials*, 13(6), (Mar. 2001),396-400.

Welser, J, "Strain dependence of the performance enhancement in strained-Si n-MOSFETs", *IEEE International Electron Devices Meeting 1994. Technical Digest*, (Dec. 11-14, 1994),373-376.

Whitwer, F. D., et al., "DLTS characterization of precipitation induced microdefects", in in Wittmer et al., editors, *Materials Issues in Silicon Integrated Circuit Processing Symposium*, (Apr. 1986),53-57.

Wijaranakula, W., et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR,(Sep.-Oct. 1986),698-704.

Wijaranakula, W., et al., "Effect of preanneal heat treatment on oxygen precipitation in epitaxial silicon", *Materials Issues in Silicon Integrated Circuit Processing Symposium*, (Apr. 1986), 139-44.

Wijaranakula, W., et al., "Internal Gettering Heat Treatments and Oxygen Precipitation in Epitaxial Silicon Wafers", *Journal of Materials Research*, 1(5), Dept. of Electr & Comput. Eng, Oregon State Univ., Corvallis, OR,(Sep.-Oct. 1986),693-7.

Wijaranakula, W., et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987),2310-16.

Wild, M., "Laser Assisted Bonding of Silicon and Glass in Micro-System Technology", http://www.ilt.fhg.de/eng/jb00-s42.html, Fraunhofer ILT—jb00-s42,(2003),1.

Xia, Y, "Photonic Crystals", *Advanced Materials*, 13(6), (Mar. 2001),369.

Xia, Y, "Self-Assembly Approaches to Three-Dimensional Photonic Crystals", *Advanced Materials*, 13(6), (Mar. 2001),409-413.

Xiao, Q., et al., "Preparation of thin Strained Si Film by Low Temperature Ge Ion Implantation and High Temperature Annealing", *Solid-State and Integrated Circuits Technology, 2004. Proceedings 7th Int'l Conf.*, 3(3), (Oct. 18, 2004),2163-2166.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000),67-68.

Yablonovitch, E, "Inhibited spontaneous emission in solid-state physics and electronics", *Physical Review Letters*, 58(20), (May 18, 1987),2059-62.

Yablonovitch, E, "Photonic band structure: the face-centered-cubic case employing nonspherical atoms", *Physical Review Letters*, 67(17), (Oct. 21, 1991),2295-8.

Yang, D., et al., "Intrinsic Gettering in Nitrogen Doped Czochralski Crystal Silicon", *High Purity Silicon VI. Proceedings of the Sixth International Symposium* (Electrochemical Society Proceedings vol. 2000-17) (SPIE vol. 4218), (2000),357-61.

Yang, Deren, et al., "Nitrogen in Czochralski Silicon", *2001 6th International Conference on Solid-State and Integrated Circuit Technology. Proceedings*, 1(1), (2001),255-60.

Yang, P, "Patterning Porous Oxides within Microchannel Networks", *Advanced Materials*, 13(6), (Mar. 2001),427-431.

Yin, Haizhou, "High Ge-Content Relaxed Sil-xGex Layers by Relaxation on Complaint Substrate with Controlled Oxidation", *Electronic Materials Conference*, Santa Barbara, Jun. 2002, 8.

Zhu, Z H., et al., "Wafer bonding and its application on compliant universal (CU) substrates", *Conference Proceedings, 10th Annual Meeting IEEE Lasers and Electro-Optics Society*, (Nov. 10-13, 1996),31.

Zhu, Z H., et al., "Wafer bonding technology and its applications in optoelectronic devices and materials", *IEEE Journal of Selected Topics in Quantum Electronics*, (Jun. 1997),927-936.

\* cited by examiner

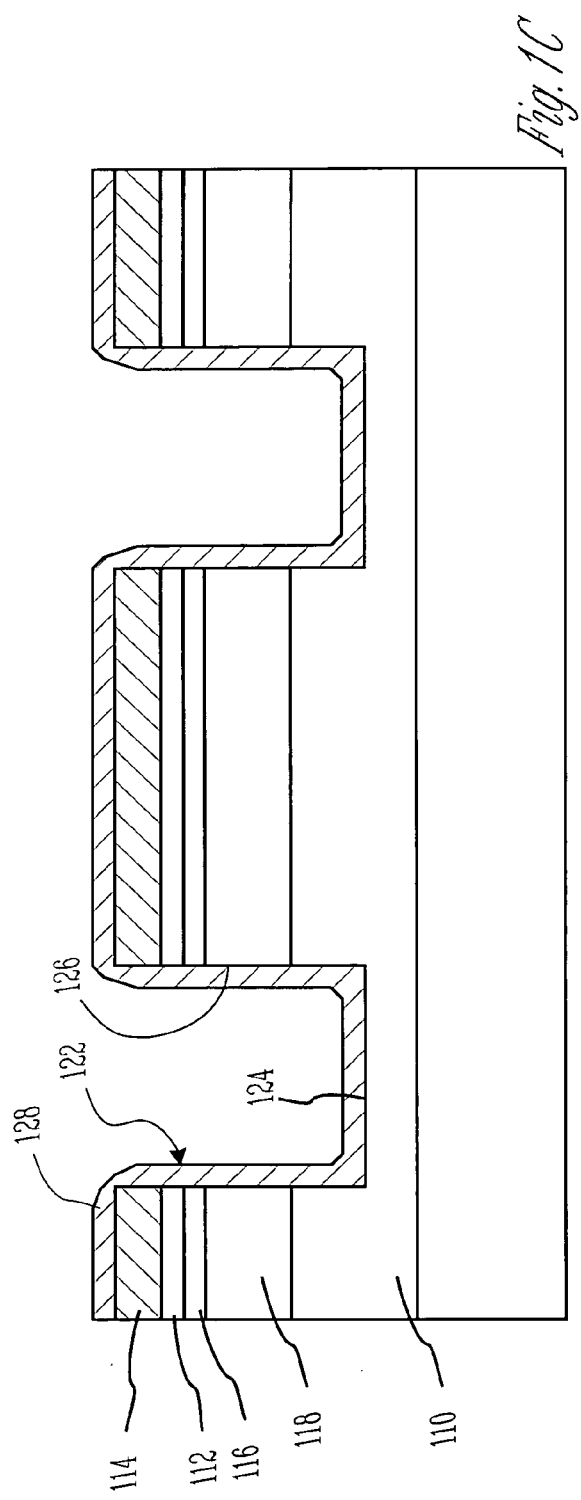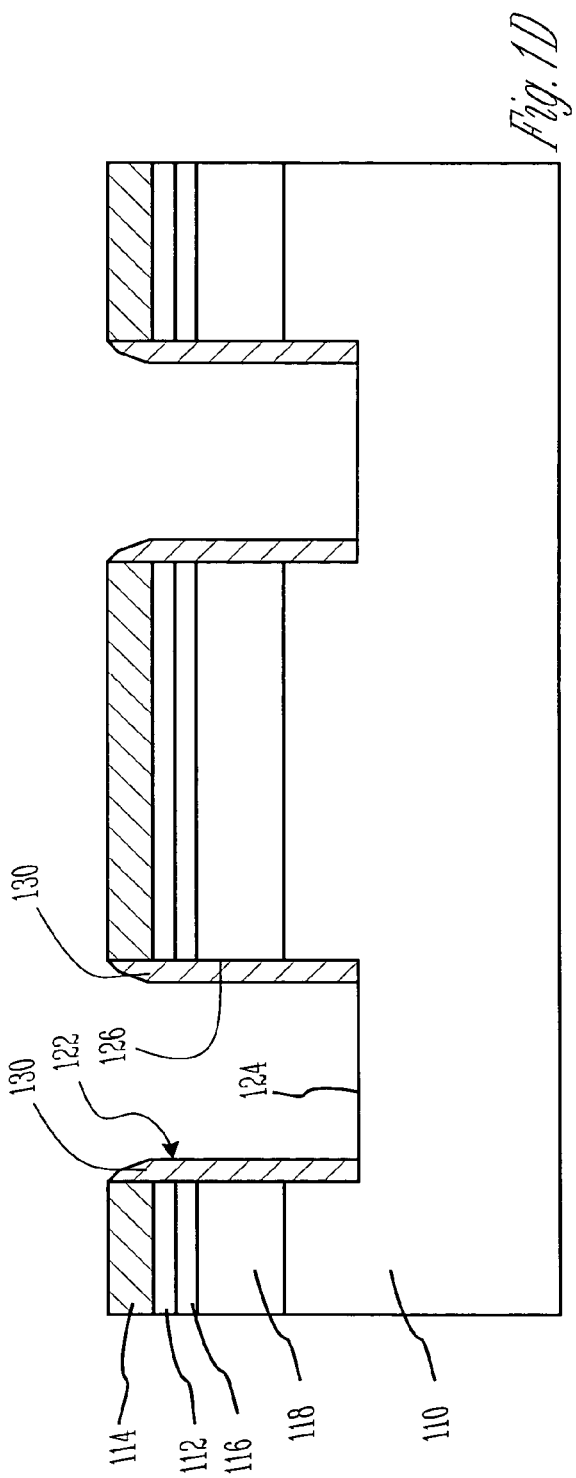

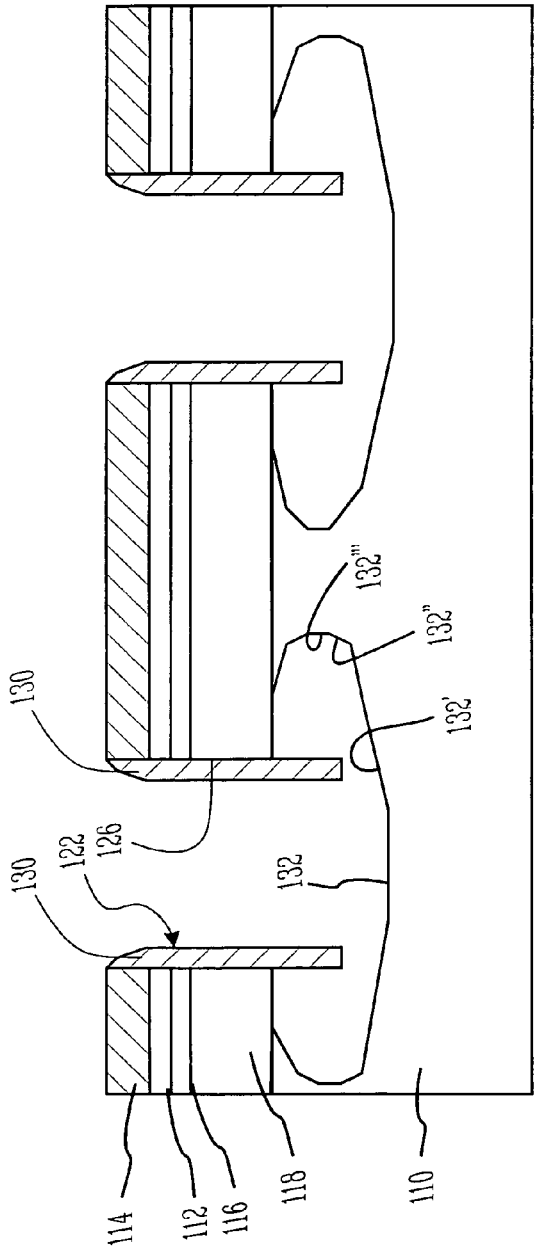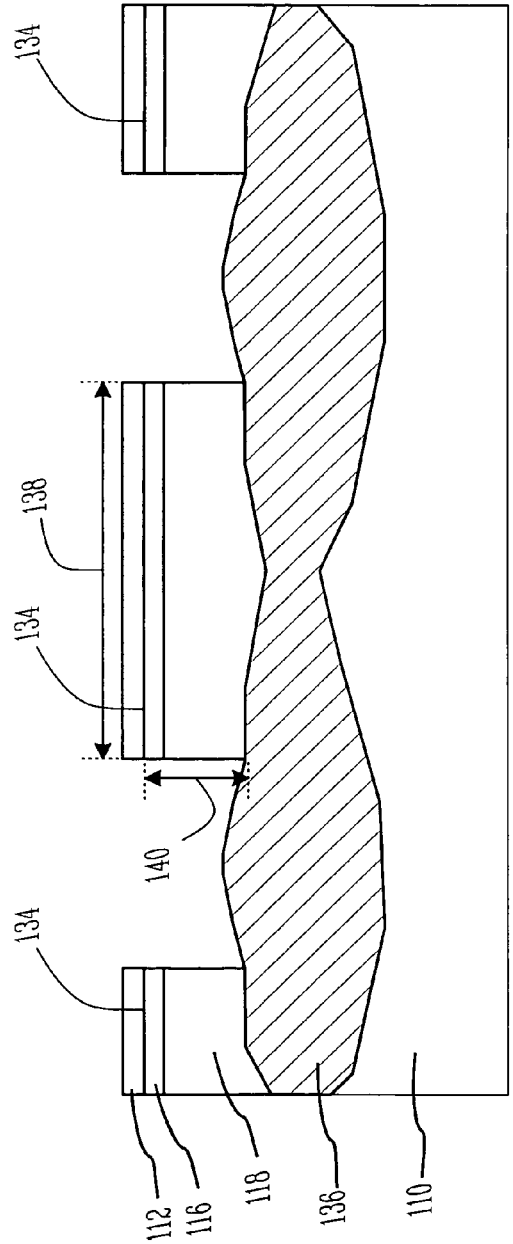

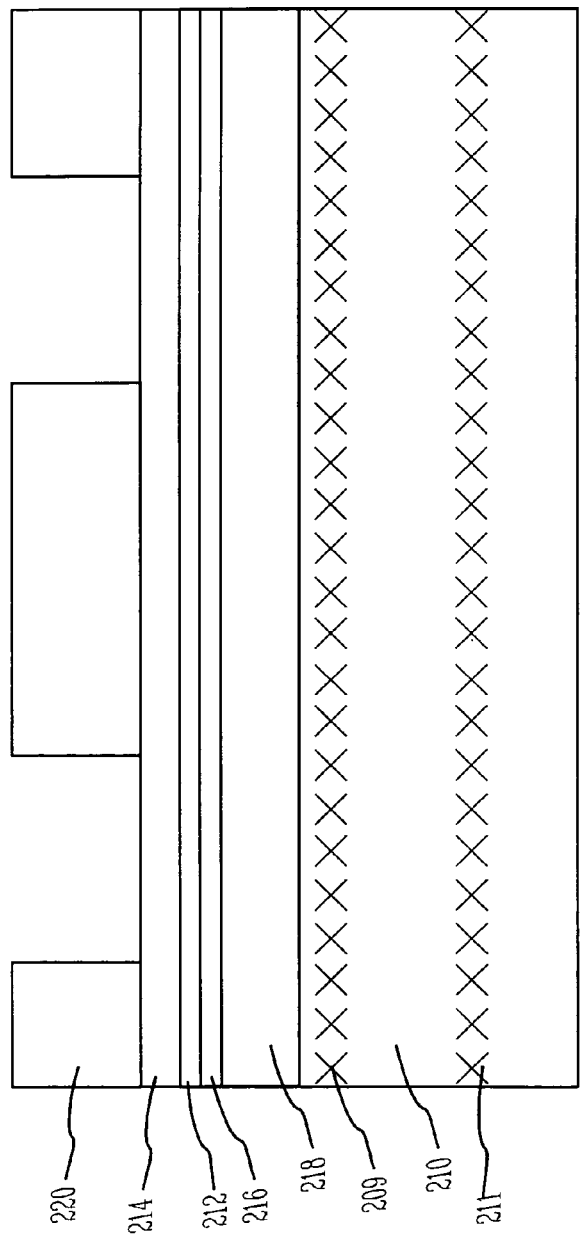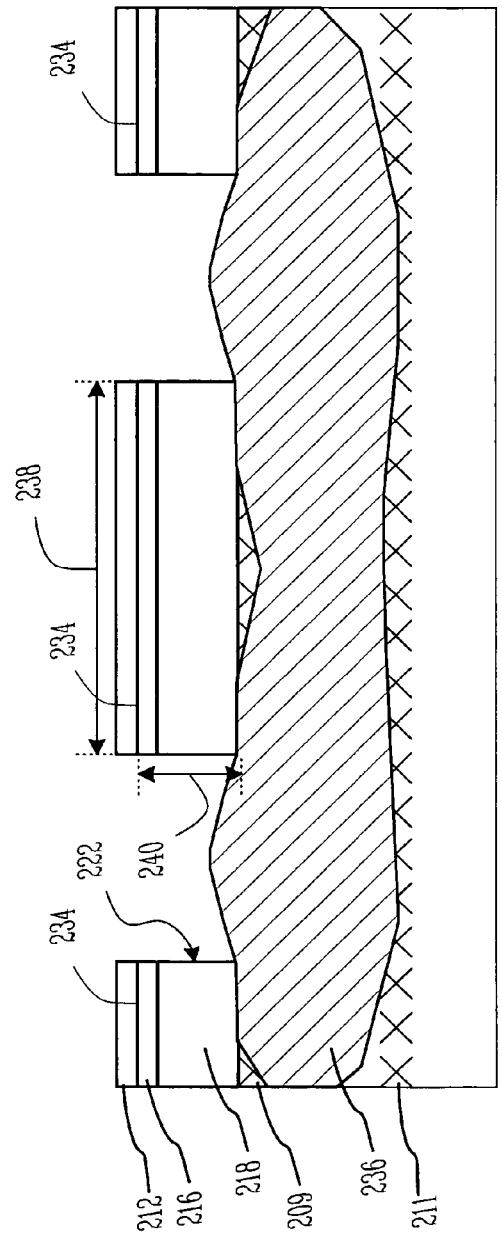

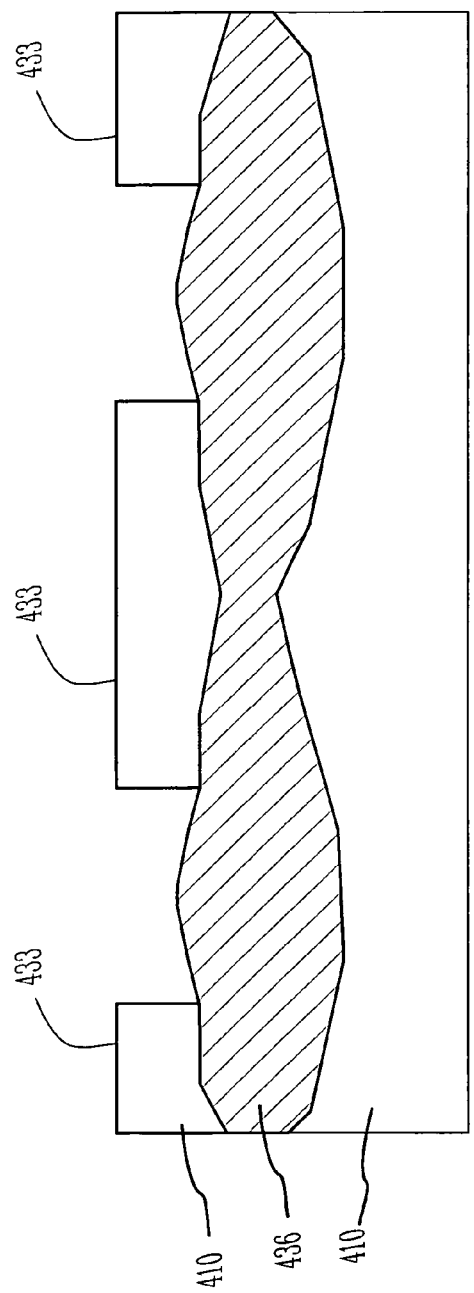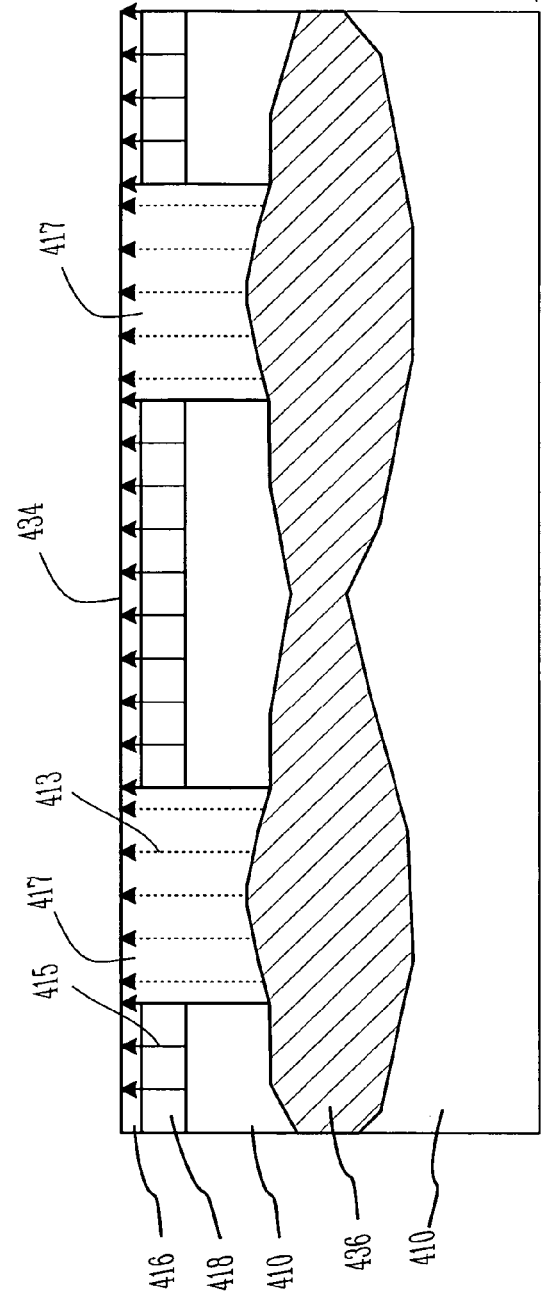

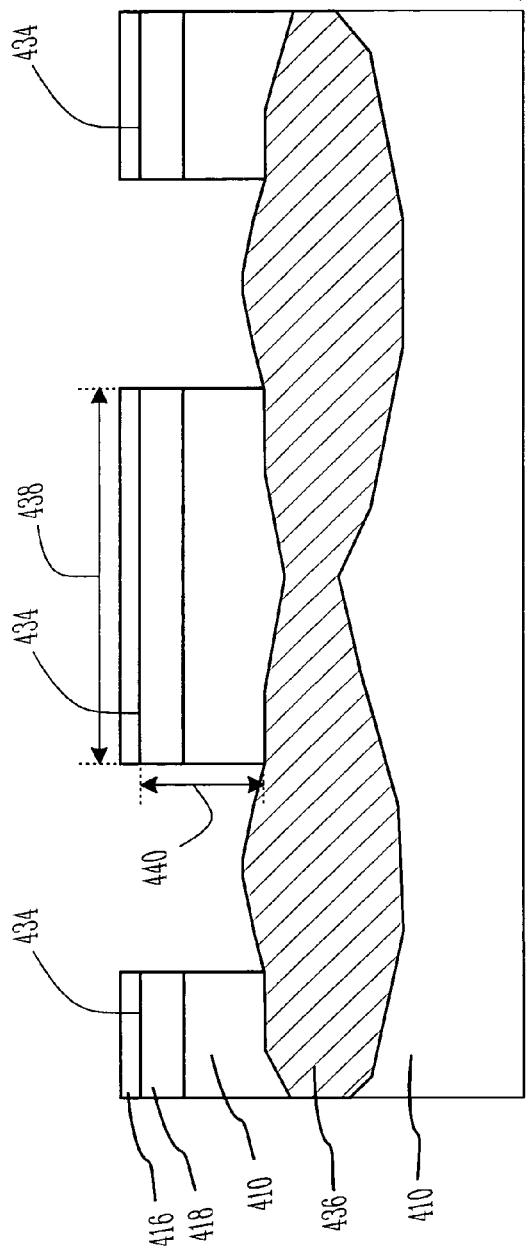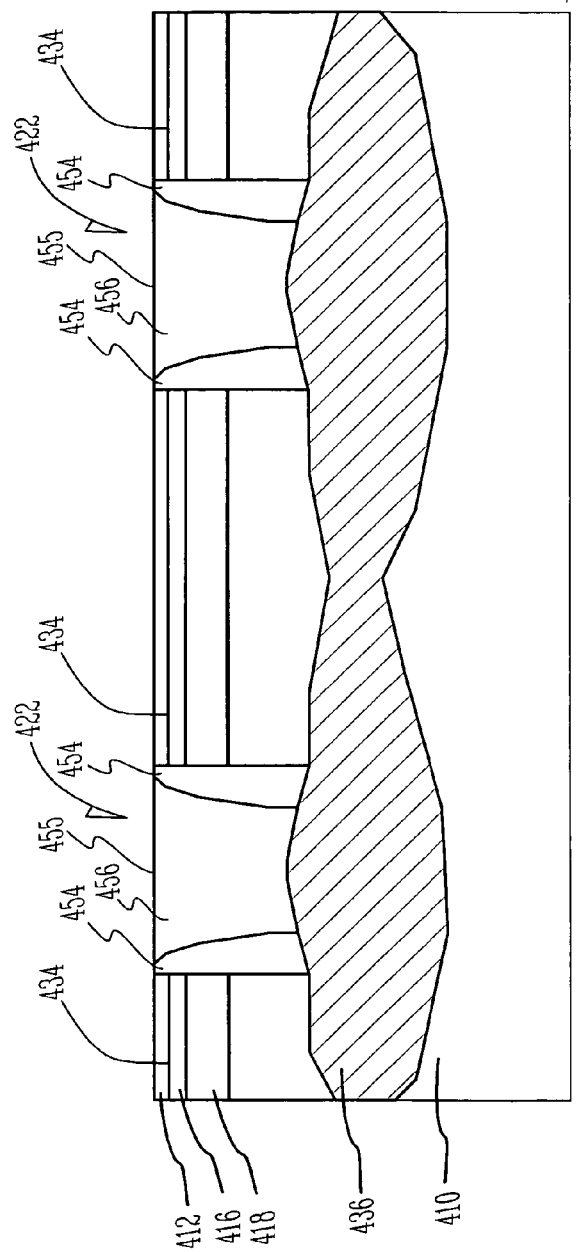

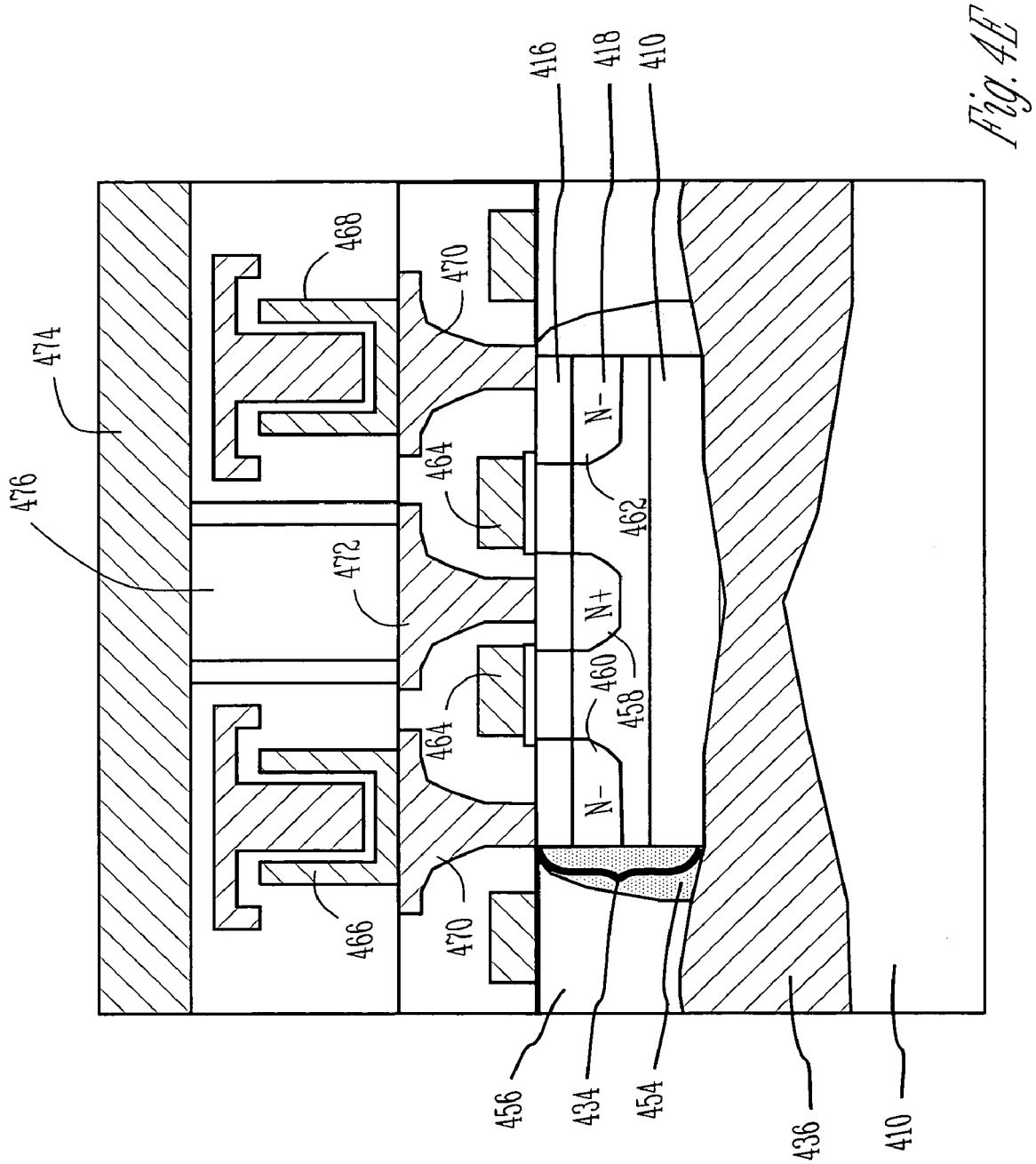

STRAINED SI/SIGE/SOI ISLANDS AND PROCESSES OF MAKING SAME

CROSS REFERENCE TO RELATED APPLICATIONS

The present application is a divisional of U.S. application Ser. No. 10/634,174, filed on Aug. 5, 2003 now U.S. Pat. No. 7,153,753, which is incorporated herein by reference.

This application is related to the following commonly assigned U.S. patent applications which are herein incorporated by reference in their entirety: "Output Prediction Logic Circuits With Ultra-Thin Vertical Transistors and Methods of Formation," U.S. application Ser. No. 10/164,611, filed on Jun. 10, 2002; "Micro-Mechanically Strained Semiconductor Film," U.S. application Ser. No. 10/379,749, filed on Mar. 5, 2003; "Localized Strained Semiconductor on Insulator," U.S. application Ser. No. 10/425,797, filed on Apr. 29, 2003; "Strained Semiconductor By Wafer Bonding with Misorientation," U.S. application Ser. No. 10/425,484, filed on Apr. 29, 2003; "Micromechanical Strained Silicon By Wafer Bonding," U.S. application Ser. No. 10/431,137, filed on May 7, 2003; and "Strained Si/SiGe Structures by Ion Implantation," U.S. application Ser. No. 10/431,134, filed on May 7, 2003.

TECHNICAL FIELD

This disclosure relates generally to semiconductor structures, and more particularly, to strained silicon-on-insulator (SSOI) structures.

BACKGROUND

One area of interest for improving the speed and performance of semiconductor devices includes strained silicon technology, which has been shown to enhance carrier mobility in both n-channel and p-channel devices, and is being considered to improve the electron mobility and drift velocity in n-channel MOSFETs in complementary metal oxide semiconductor (CMOS) technology.

There has been considerable research using strained silicon germanium layers on silicon to increase the hole mobility of p-channel CMOS transistors. Thin layers of silicon germanium have been fabricated on silicon because of the tolerance of the thin silicon germanium layers to strain.

Solid phase epitaxial (SPE) regrowth of silicon on sapphire is known. The SPE regrowth of silicon reduces defects and dislocations that occur during the initial epitaxial deposition of silicon on sapphire because of a large lattice mismatch. A silicon implant amorphizes the initial silicon layer, and regrowth is accomplished at a low temperature. Subsequently, strained layers of silicon germanium have been grown on silicon by SPE.

Silicon germanium layers have been grown on silicon by ion implantation and regrowth by laser melting. Silicon germanium layers have also been formed by ion implantation and regrowth by SPE. The use of ion implantation to form silicon germanium layers, and the use of SPE to regrow layers of silicon germanium on silicon have been described separately and in combination with one another.

Thin layers of strained silicon are being considered for CMOS n-channel devices. Thinner layers of silicon are more tolerant of strain. One technique for producing strained silicon involves epitaxially growing the silicon and silicon germanium layers using an ultra-high vacuum chemical vapor deposition (UHVCVD) process, a costly and complex process, to form silicon layers on relaxed silicon germanium layers. A large mismatch in the cell structure causes a pseudo-morphic layer of silicon on relaxed silicon germanium to be under biaxial tensile strain. The biaxial strain modifies the band structure and enhances carrier transport in the silicon layer.

The strain on the silicon layer depends of the lattice constant difference between silicon and silicon germanium. The lattice constant of silicon germanium is between the lattice constant of silicon (5.43095 Å) and the lattice constant of germanium (5.64613 Å), and depends on the percentage of germanium in the silicon germanium layer.

There is a need in the art to provide improved methods of forming strained silicon structures to improve the speed and performance of semiconductor devices such as CMOS n-channel devices.

SUMMARY

The above mentioned problems and challenges are overcome by embodiments of this invention. One embodiment is directed to a process of forming a vertically isolated strained silicon-on-insulator (SSOI) structure of sufficient size to permit the fabrication of an active device thereon. One embodiment of the process includes forming an etch-selective region in the semiconductive workpiece that restricts the effects of an isotropic etch. The etch-selective region is created by implantation that causes the semiconductive material to become amorphous.

Protective material, such as a polysilicon layer and a nitride layer, is deposited over a pad oxide layer to protect the pad oxide layer. An active area is defined by patterning a mask. The protective material, the pad oxide layer, and finally the substrate are etched to form a trench around the active area. A protective film such as nitride material, is formed upon exposed silicon. An isotropic etch follows that acts to substantially insulate the active area by its undercutting effect. Thereafter, an oxidation process is done to totally isolate the active area from adjacent active areas and the substrate. Oxide spacers are formed on the sides of the active area, and the remainder of the trench is filled to form a shallow trench isolation (STI) structure.

Because the diode junctions of active devices are formed in areas of the substrate that are isolated from the remainder of the substrate, the diode junctions are fabricated to be less leaky.

BRIEF DESCRIPTION OF THE DRAWINGS

In order that the manner in which embodiments are obtained, a more particular description of the embodiments briefly described above will be rendered by reference to specific embodiments which are illustrated in the appended drawings. These drawings depict embodiments that are not necessarily drawn to scale and are not to be considered to be limiting of its scope. The claimed subject matter will be described and explained with additional specificity and detail through the use of the accompanying drawings in which:

FIG. 1C illustrates the structure depicted in FIG. 1B after further processing;

FIG. 1D is a side cross-section of the structure depicted in FIG. 1C after further processing;

FIG. 1E illustrates further processing of the substrate depicted in FIG. 1D;

FIG. 1F illustrates further processing of the substrate depicted in FIG. 1E;

FIG. 2A is a side cross-section of a semiconductor structure according to an embodiment;

FIG. 2B illustrates further processing of the substrate depicted in FIG. 2A;

FIG. 4A is a side cross-section of a semiconductor structure according to an embodiment;

FIG. 4B is a side cross-section of the structure depicted in FIG. 4A after further processing;

FIG. 4C is a side cross-section of the structure depicted in FIG. 4B after further processing FIG. 4D is a side cross-section of the structure depicted in FIG. 4C after further processing;

FIG. 4E is a side cross-section of the structure depicted in FIG. 4D after further processing;

DETAILED DESCRIPTION

The following detailed description refers to the accompanying drawings that show, by way of illustration, specific aspects and embodiments in which various embodiments may be practiced. The various embodiments are not necessarily mutually exclusive as aspects of one embodiment can be combined with aspects of another embodiment. Other embodiments may be utilized and structural, logical, and electrical changes may be made without departing from the scope of the claimed subject matter.

In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms wafer and substrate used in the following description include any structure having an exposed surface with which to form the integrated circuit (IC) structure relating to claimed subject matter. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The terms "horizontal" and "vertical", as well as prepositions such as "on", "above", "below", "over" and "under" are used in relation to the conventional plane or surface of a wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Strained silicon is provided using an improved method for forming a strained silicon layer on a silicon germanium structure. One improved method embodiment includes implanting germanium ions into a silicon substrate, and performing an SPE process to regrow a crystalline silicon layer over a resulting silicon germanium layer in the substrate.

Figure 1A:
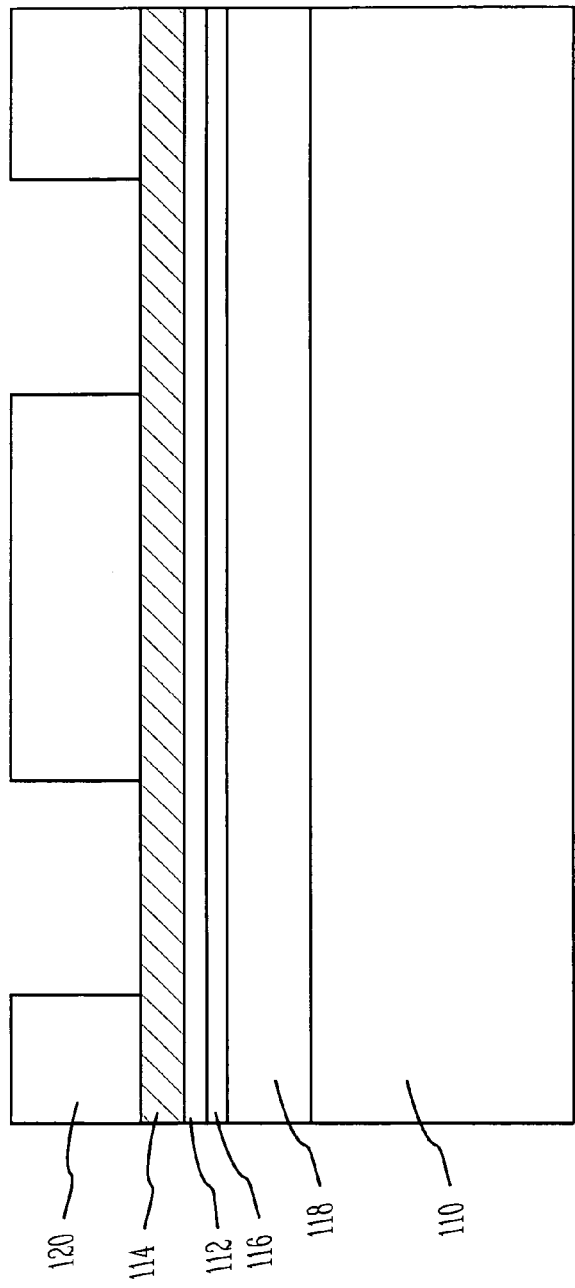
FIG. 1A is a side cross-section of a semiconductive structure according to an embodiment.

FIG. 1A is a side cross-section of a semiconductive structure according to an embodiment. A substrate 110 is provided that includes a semiconductive material. The substrate 110 has a pad oxide layer 112 deposited thereon. As used herein, the term deposited is used broadly to mean layers that are not only deposited in the traditional sense, but layers of material that are grown or in any other manner caused to be formed. A protective layer 114 is deposited on top of the pad oxide layer 112 to act as a buffer during subsequent etch steps and other processing. In one embodiment, the protective layer 114 is polysilicon. In one embodiment, the protective layer 114 is a nitride material. In another embodiment, the protective layer 114 is a polysilicon layer that is covered with a nitride material. The specific combination is selected depending upon process integration choices, among other design choices.

Below the pad oxide layer 112, a strained silicon layer 116 has been formed above a semiconductive silicon compound that is a relaxed or a semi-relaxed layer 118 (hereinafter "relaxed layer"). Strained silicon is provided using a method for forming a strained silicon layer on a silicon compound structure. In one embodiment, a silicon germanium structure is the relaxed layer 118. Other silicon-compound structures can be used according to a specific process integration. In one embodiment, the process includes implanting germanium ions into a silicon substrate 110, and performing a solid-phase epitaxy (SPE) process to regrow a crystalline silicon layer over a resulting silicon germanium layer in the substrate 110.

FIG. 1A illustrates the result of a method of forming a strained silicon layer 116 on a silicon germanium (Si/SiGe) structure 118 (that later becomes the relaxed layer 118) by ion implantation, according to various embodiments. In one embodiment, germanium ions are implanted into a p-type silicon wafer 110, as represented in FIG. 1A. In various embodiments, the dose of the germanium ion implant is approximately $10^{17}/cm^2$, and the energy of the germanium ion implant is less than 200 KeV.

As depicted in FIG. 1A, the relatively high dose and energy of the germanium ion implant, that becomes the relaxed layer 118, in the silicon substrate 110 results in a region of silicon that contains germanium ions, represented as 118, on the silicon substrate 110. Formation of the relaxed layer 118 further results in an amorphized, or at least a partially amorphized, silicon layer 116 at the surface. In various embodiments, if the germanium ion implant did not completely amorphize the silicon layer 116, a silicon ion implant is used to further amorphize the silicon layer 116. In various embodiments, the dose of this silicon ion implant to amorphize the silicon layer 116 is approximately $10^{15}/cm^2$ and the energy of this silicon ion implant is less than 170 KeV.

During an ion implantation process, the ions can channel along the crystal directions of the substrate 110, such that the ions do not encounter nuclei and are slowed down mainly by electronic stopping. Channeling can be difficult to control, and can cause the ions to penetrate several times deeper than intended. In various embodiments, to avoid channeling during the germanium ion implant, the substrate 110 is amorphized using a silicon ion implant to prepare the substrate for the germanium ion implant. In various embodiments, the dose of this silicon ion implant is approximately $10^{15}/cm^2$ and the energy of this silicon ion implant is greater than 50 KeV. Preparing the substrate 110 using the silicon ion implant to amorphize the substrate 110 results in better depth control during the germanium ion implant process. In one embodiment, the implant is disposed below the germanium ion implant, and it is used as a deep implantation (such as lower deep implant 211, FIG. 2A) as discussed below.

After implanting to form the germanium ion implant that becomes the relaxed layer 118, the substrate 110 is heat treated, such that the amorphized layers are regrown by a solid phase epitaxy (SPE) process. In various embodiments, the SPE process involves heating the structures at temperatures within a range of approximately 550° C. to 700° C. for a time within a range from approximately one hour to approximately two hours. The resulting substrate 110 includes the silicon region that contains germanium ions, forms a silicon germanium ($Si_{1-x}Ge_x$) relaxed layer 118, and the amorphous silicon layer 116 regrows into a more crystalline strained silicon layer 116 over the silicon germanium relaxed layer 118. In various embodiments, the strained silicon layer 116 is approximately 20 nm thick. However, the present invention is not limited to a particular thickness. The thickness of the strained silicon layer 116 is controlled by the energy of the implant. One of ordinary skill in the art will understand, upon reading and comprehending this disclosure, how to control the germanium implant to achieve a desired thickness of the strained silicon layer 116.

The lattice mismatch of the strained silicon layer 116 at the surface with the underlying silicon germanium relaxed layer 118 causes the strained silicon layer 116 to be strained. In various embodiments, N-channel CMOS devices are fabricated in this strained silicon layer 116 using conventional techniques, which are not described here for the sake of brevity.

One of ordinary skill in the art will understand, upon reading and comprehending this disclosure, that the concentration of germanium in the relaxed layer 118 is controlled by the dose and energy of the germanium ion implant process. Additionally, one of ordinary skill in the art will understand, upon reading and comprehending this disclosure, that the concentration of germanium in the relaxed layer 118 can be graded by controlling the dose and energy of two or more germanium ion implant process. A benefit of grading germanium concentration involves forming a silicon germanium layer 118 on the substrate 110 to have a relaxed silicon germanium surface upon which the strained silicon layer 116 is formed.

According to further processing, a mask 120 is formed and patterned upon the protective layer 114. In one embodiment, the mask 120 is a photoresist material that is spun on, exposed, cured, and patterned. In another embodiment, the mask 120 is a hard mask material such as a nitride or oxide. The area protected by the mask 120 defines what will become an active area in a strained silicon-on-insulator (SSOI) structure (hereinafter, "SSOI active area").

Figure 1B:
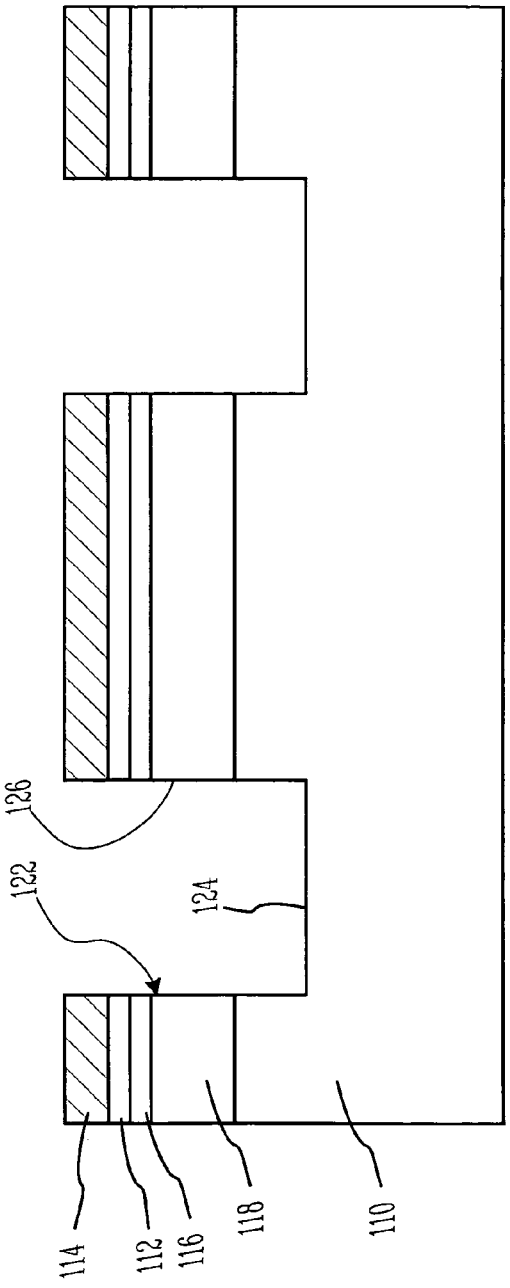
FIG. 1B is a side cross-section of the structure depicted in FIG. 1A after further processing.

FIG. 1B is a side cross-section of the structure depicted in FIG. 1A after further processing. FIG. 1B illustrates an embodiment after an etch process that has exposed the regions unprotected by the mask 120. In the etch process, the protective layer 114 and the pad oxide layer 112 have also been patterned, and a recess 122 has been formed with a recess bottom 124 and a recess wall 126. In one embodiment, the etch is anisotropic.

FIG. 1C illustrates the structure depicted in FIG. 1B after further processing. A nitride film 128 has been grown onto the exposed semiconductive material of the substrate 110 and elsewhere. In one embodiment, the exposed semiconductive material of the substrate 110 is exposed silicon. The nitride film 128 is depicted as covering the recess bottom 124, the recess wall 126, and the protective layer 114. The nitride film 128 may be grown by known processes under conditions that deposit only upon semiconductive material such as exposed silicon. One such process is remote-plasma nitridation (RPN). In RPN, a nitride-bearing plasma is struck, remote from substrate 110, but within the deposition tool, and the nitride-bearing plasma is carried by convective force toward the substrate 110. In one embodiment, an RPN process is carried out in a time range from about 10 seconds to about 10 minutes. In another embodiment, an RPN process is carried out in a time range from about 1 minute to about 3 minutes. Another process that may be used to form the nitride film 128 is rapid thermal nitridation (RTN). Such processing is also known in the art.

Alternative to the formation of a nitride film 128, an oxide film may be formed, either by remote-plasma oxidation (RPO) or by rapid thermal oxidation (RTO). Similarly, a combination of an oxide and a nitride is formed according to an embodiment as set forth herein. In one embodiment, the placement of the oxide precedes the placement of the nitride, or vice versa. Similarly, an oxynitride film is formed in the place of the nitride film 128 according to an alternative embodiment. The process is carried out by either a remote plasma process or a rapid thermal process. Although not limiting the embodiments disclosed, for convenience throughout the remainder of the disclosure, the film 128 is referred to as the "nitride film 128".

FIG. 1D is a side cross-section of the structure depicted in FIG. 1C after further processing. FIG. 1D illustrates processing of the substrate 110 in which a spacer etch has formed a spacer 130 from the nitride film 128. The spacer etch is selective to not etch the material in the recess 122 that forms the recess bottom 124. Therefore in one embodiment, the recess bottom 124 is exposed in the spacer etch, but it is not significantly etched.

FIG. 1E illustrates further processing of the substrate 110 depicted in FIG. 1D. After the spacer etch, which formed the spacer 130, an isotropic etch forms a "bubble" recess 132 in the substrate 110. The isotropic etch forms the bubble recess 132 in preparation for a subsequent oxidation process. The bubble recess 132 is depicted in arbitrary shape and size. Qualitative characteristics of the bubble recess 132, however include an incomplete undercut of the material that forms the relaxed layer 118. The extent of the etch to form the bubble recess 132, qualitatively speaking, leaves enough material in the substrate 110 to prevent a total undercutting, but leaves enough to allow further processing without significant damage to the positioning of the relaxed layer 118.

In one embodiment, an etch recipe is used that is selective to the material of the relaxed layer 118 and to the protective layer 114, but the etch recipe removes bulk semiconductive material in the substrate 110. In one embodiment, the etch recipe is a wet tetramethyl ammonium hydroxide (TMAH) etch as is known in the art. In another embodiment, the wet etch uses a potassium hydroxide (KOH) etch chemistry that is known in the art. The TMAH etch chemistry is desirable because it is selective such that it etches the bulk silicon of the substrate 110, but does not substantially etch the relaxed layer 118. In one embodiment, the selectivity is in a range from about 5:1 to about 20:1. In another embodiment, the selectivity is about 10:1. The isotropic etch may also be combined with an anisotropic etch, either before or after the isotropic etch. By using both an isotropic and an anisotropic etch, both the downward etching and the undercutting of the relaxed layer 118 may be varied to suit particular applications.

Various wet TMAH etch recipes are known that are selective to disturbed-lattice silicon such as the relaxed layer 118 and ion-channeling-preventive layers, and to nitride films (or oxide films, or oxynitride films), and that isotropically etch bulk monocrystalline silicon along crystallographic planes. FIG. 1E illustrates the results of a TMAH etch that has formed the bubble recess 132 that has undercut what will become the SSOI active area 134 (FIG. 1F). By this undercutting etch, the active area has been mostly isolated from the bulk semiconductive material in the substrate 110, below the level of the relaxed layer 118.

Under the etch conditions, and due to the scale of the bubble recess 132, a distinctive contour may appear therein. The TMAH etch has an effect along crystallographic planes such that a faceted contour may appear within the bubble recess 132. It can be seen that faceted surfaces 132, 132', 132", 132''', etc., are illustrated on one side. However, these are depicted in arbitrary shape, angle and size for illustrative purposes, and the specific shapes, angles, and sizes of the faceted surfaces will depend upon the crystallographic orientation of the bulk semiconductive material in the substrate 110 and upon the specific etch recipe and conditions, among other factors.

Under the specific etch conditions, a photomicrographic view of the bubble recess 132 depicts substended crystallographic planes of bulk semiconductive material in the substrate 110 that have been exposed by an etch such as the TMAH etch.

FIG. 1F illustrates further processing of the substrate 110 depicted in FIG. 1E to form a strained Si/SiGe/SOI island according to an embodiment. After the isotropic etch forms the bubble recess 132, an oxidation process is carried out to vertically isolate an SSOI active area 134 by the formation of a mini-field oxidation (MFOX) 136. In one embodiment, the oxidation process is carried out with the protective layer 114 and the spacers 130 in place (FIG. 1E), followed by a nitride etch to remove them.

Oxidation time will depend upon the area of the partially isolated structure that includes the undercut relaxed layer 118. In one embodiment, oxidation parameters include a processing temperature from about 850° C. to about 1,100° C. The ambient is with wet or dry oxygen ($O_2$), and atmospheric pressure or higher. In one example, a temperature of about 850° C. and a wet oxygen ambient is applied at about 1 atmosphere and for a sufficient time to allow about 0.1 micron horizontal oxidation under the relaxed layer 118, and about 0.1 micron vertical oxidation upwardly in the direction of the relaxed layer 118. High pressure may be used to reduce the time required for oxidation and to control the amount of oxide that forms behind the nitride spacer 130. High pressure includes atmospheric pressure, up to about 2 atmospheres and higher including from about 2 to about 5 atmospheres.

Similar to the qualitative size and shape of the bubble recess 132, the MFOX 136 is also depicted in arbitrary shape and size. The actual size and shape of the MFOX 136 will be influenced by etch and oxidation conditions according to a process integration. One characteristic of forming the MFOX 136 requires an oxidation process that leaves the SSOI active area 134 firmly attached to the substrate 110 through the MFOX 136. By this process, oxidation is sufficient to vertically isolate the strained silicon 112 from the substrate 110 to create the SSOI active area 134. Processing conditions can be ascertained by reading this disclosure and by ordinary experimentation.

The oxidation process affects the integrity of the SSOI active area 134. For a 0.25-micron critical-dimension 138 (CD or minimum feature) process, the SSOI active area 134 has a height 140 in a range from about 0.1 microns to about 0.15 microns. Alternatively, for a 0.15-micron CD process, the SSOI active area 134 has a height 140 in a range from about 0.07 microns to about 0.12 microns.

According to an embodiment, the formation of the MFOX 136 is carried out under conditions to prevent destructive stresses in the newly formed SSOI active area 134. One of ordinary skill in the art can conduct the minifield oxidation in the bubble recess 132 without causing destructive stresses in the SSOI active area 134.

FIG. 2A is a side cross-section of a semiconductor structure according to an embodiment. In this embodiment, a two-tiered deep implantation has been carried out. The two-tiered deep implantation is done to facilitate a more lateral isotropic etch than the etch depicted in FIG. 1E. The two-tiered implantation can also assist as anti-channeling processing. FIG. 2A is depicted at a processing flow similar to the structure depicted in FIG. 1A, with the additional processing of the two-tiered deep implantation.

In one embodiment, the deep implantations 209 and 211 form layers in the bulk semiconductive material in the substrate 210. Implantation is carried out at an energy level that achieves self-interstitial implantation, and that causes the deep implantations 209 and 211 to become amorphous enough to have an etch responsiveness that is different from the bulk semiconductive material in the substrate 210. In one embodiment, implantation conditions use a silicon source that is implanted to a monocrystalline-to-self interstitial ratio of about 3:1. By "silicon source" it is meant in one embodiment that silicon or another Group IV element is used, or a combination such as silicon and germanium. In one embodiment, the implanted concentration is from about $10^{14}/cm^2$ to about $5 \times 10^{15}/cm^2$ at process conditions of ambient temperature (20 C to about 30 C) and an implantation energy of greater than about 50 KeV. In one embodiment, a silicon source that is substantially equivalent to the silicon chemistry of the bulk of the semiconductive substrate 210, is implanted to a concentration of about $10^{14}/cm^2$ and process conditions are about 25 C and an implantation energy of about 85 KeV.

A substrate 210 is provided that includes a semiconductive material. The upper deep implantation 209 and the lower deep implantation 211 are provided for subsequent processing. The substrate 210 also has a pad oxide layer 212 deposited thereon. A protective layer 214 is deposited on top of the pad oxide layer 212 to act as a buffer during subsequent etch steps and other processing. The protective layer 214 can be any of the disclosed protective layers depicted and described for the embodiments illustrated in FIGS. 1A-1F, and their art-recognized equivalents that are understood by reading this disclosure.

Below the pad oxide layer 212, a strained silicon layer 216 has been formed above a relaxed or semi-relaxed layer 218 (hereinafter, relaxed layer 218). The relaxed layer 218 can be a semiconductor compound silicon layer. In one embodiment, a silicon germanium structure is the relaxed layer 218. Other silicon-compound structures can be used according to a specific process integration.

According to a process flow embodiment, the substrate 210 is implanted with the relaxed layer 218, at least the lower deep implantation 211 and the upper deep implantation 209. The pad oxide layer 212 and the protective layer 214 are patterned with the mask 220. An etch is carried out to form a recess (222, FIG. 2B) that is similar to the recess 122 depicted in FIG. 1B. Thereafter, a nitride film (not pictured) is grown and spacer etched similar to the respective nitride film 128 and spacer 130 depicted in FIGS. 1C and 1D.

Subsequent to a spacer etch, a "flattened bubble" recess (not pictured) is formed by an isotropic etch. The flattened bubble is formed because of the upper deep implantation 209 and the lower deep implantation 211. In this embodiment, the etch recipe that is used is more selective to leaving the upper deep implantation 209 and the lower deep implantation 211. Consequently, the flattened bubble recess is formed due to the constraining nature of the upper deep implantation 209 and the lower deep implantation 211 upon the etch. The extent of the etch to form the flat bubble, qualitatively speaking, leaves enough material in the substrate 210 to prevent a total undercutting, but leaves enough to allow further processing without significant damage to the positioning of the relaxed layer 218. In one embodiment, the etch is carried out without an upper deep implantation 209, and the relaxed layer 218 has sufficient responsiveness to an undercutting etch to be selectively etch resistant, relative to the bulk material of the substrate 210.

FIG. 2B illustrates further processing of the substrate 210 depicted in FIG. 2A to form a strained Si/SiGe/SOI island according to an embodiment. After the isotropic etch forms the flat bubble recess (not pictured), an oxidation process is carried out to vertically isolate an SSOI active area 234 by the formation of a flattened mini-field oxidation (FMFOX) 236. In one embodiment, the oxidation process is carried out with the protective layer 214 and the spacers (not pictured) in place, followed by a nitride etch to remove them.

Similar to the shape of the MFOX 136 (FIG. 1F), the size and shape of the FMFOX 236 is also depicted in arbitrary shape and size. The actual size and shape of the FMFOX 236 will be influenced by etch and oxidation conditions according to the placement of the upper deep implantation 209 and the lower deep implantation 211, their relative responses to a given etch recipe, and the extent of the oxidation process. One characteristic of forming the FMFOX 236 requires an oxidation process that leaves the SSOI active area 234 firmly attached to the substrate 210 through the FMFOX 236. By this process, oxidation is sufficient to vertically isolate the relaxed layer 218 from the substrate 210 to create the SSOI active area 234. Processing conditions can be ascertained by ordinary experimentation.

The oxidation process affects the integrity of the SSOI active area 234. For a 0.25-micron CD 238 process, the SSOI active area 234 has a height 240 in a range from about 0.1 microns to about 0.15 microns. Alternatively, for a 0.15-micron CD process, the SSOI active area 234 has a height 240 in a range from about 0.07 microns to about 0.12 microns.

According to an embodiment, the formation of the FMFOX 236 is carried out under conditions to prevent destructive stresses in the newly formed SSOI active area 234. By reading this disclosure, one of ordinary skill in the art can conduct the minifield oxidation in the flattened bubble recess without causing destructive stresses in the SSOI active area 234.

Figure 3A:
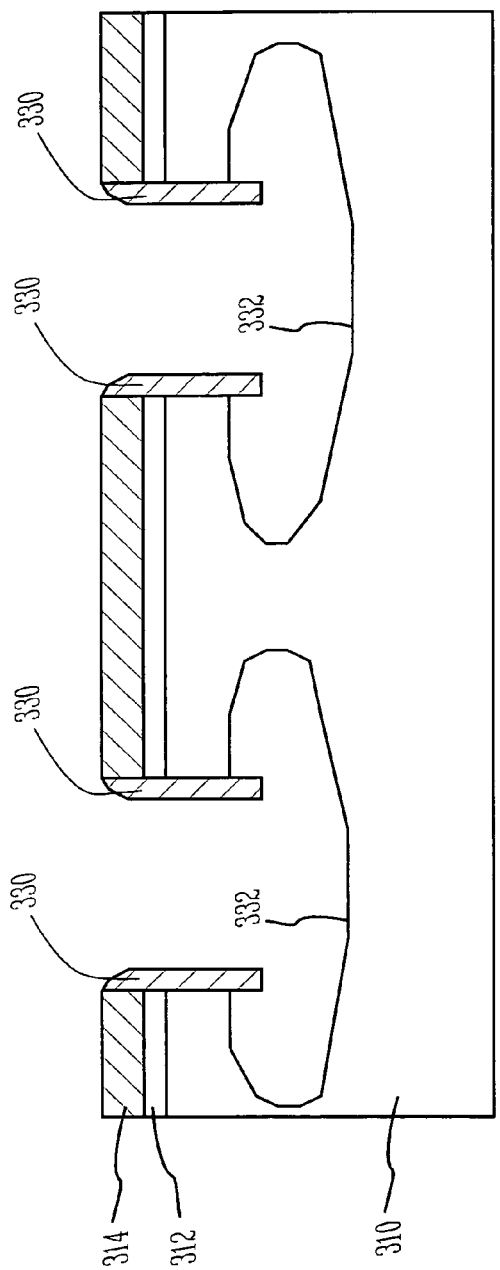
FIG. 3A is a side cross-section of a semiconductor structure according to an embodiment.

FIG. 3A is a side cross-section of a semiconductor structure according to an embodiment. In this process flow embodiment, a bubble recess 332 has been formed in a substrate 310, below a protective layer 314 that is formed upon an oxide film 312. Positioning of the bubble recess 332 is controlled by a spacer 330, which is formed according to processing embodiments set forth in this disclosure.

Figure 3B:
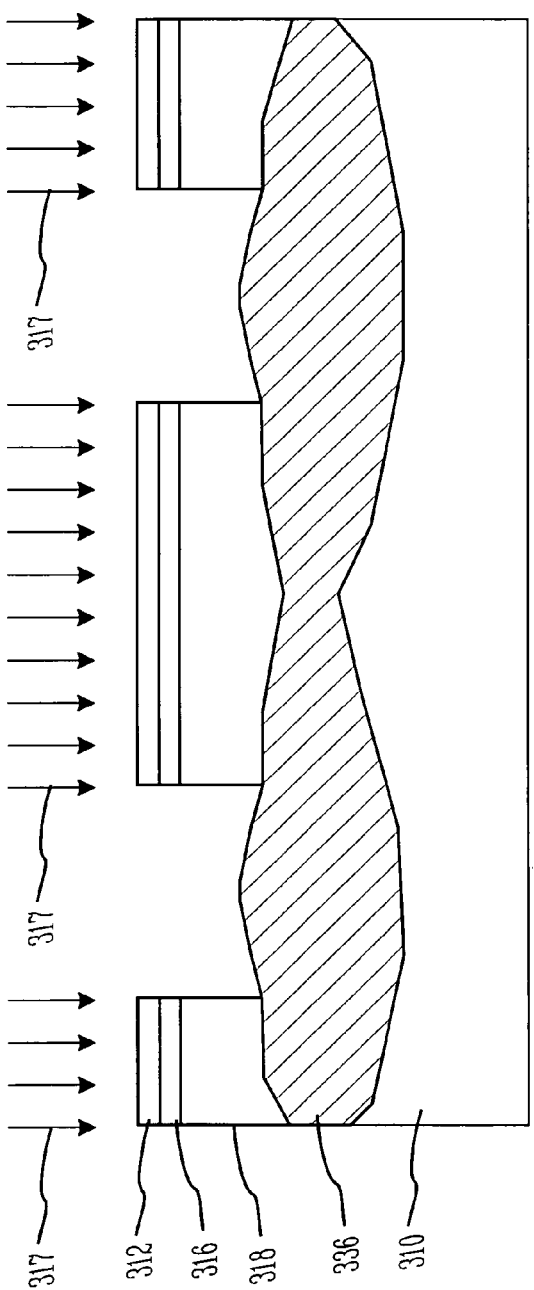
FIG. 3B is a side cross-section of the structure depicted in FIG. 3A after further processing.

FIG. 3B is a side cross-section of the structure depicted in FIG. 3A after further processing to form a strained Si/SiGe/SOI island according to an embodiment. After the isotropic etch forms the bubble recess 332, an oxidation process is carried out to vertically isolate an SSOI active area which will become the relaxed region 318 by the formation of an MFOX 336 or an FMFOX 336. In one embodiment, the oxidation process is carried out with the protective layer 314 and the spacers 330 in place, followed by a nitride etch to remove them.

Similar to the bubble recess 332, the size and shape of the MFOX 336 or the FMFOX 336 is also depicted in arbitrary shape and size. The actual size and shape of the MFOX 336 or the FMFOX 336 will be influenced by etch and oxidation conditions according to a process integration. One characteristic of forming the MFOX 336 or the FMFOX 336, requires an oxidation process that leaves the SSOI active area 318 firmly attached to the substrate 310 through the MFOX 336 or the MFOX 336. By this process, oxidation is sufficient to vertically isolate the SSOI active area 318 from the substrate 310 to create an SOI structure. Processing conditions can be ascertained by ordinary experimentation.

The oxidation process affects the integrity of the SSOI active area 318. For a 0.25-micron CD 338 process, the SSOI active area 318 has a height in a range from about 0.1 microns to about 0.15 microns. Alternatively, for a 0.15-micron CD process, the SSOI active area 318 has a height in a range from about 0.07 microns to about 0.12 microns.

According to an embodiment, the formation of the MFOX 336 or the FMFOX 336 is carried out under conditions to prevent destructive stresses in the newly formed SSOI active area 318. One of ordinary skill in the art can read this disclosure and by routine experimentation, conduct the mini field oxidation without causing destructive stresses in the SSOI active area 318.

After the formation of the MFOX 336 or the FMFOX 336, a strained silicon layer 316 is formed above the SSOI active area which may now be viewed as a relaxed region 318 according to processing embodiments disclosed herein. This process flow path includes what may be referred to as a "top-down" formation of the strained silicon layer 316, as ion implantation 317 is used. In the next embodiment, a "bottom-up" formation of a stressed silicon film is disclosed.

FIG. 4A is a side cross-section of a semiconductor structure according to an embodiment. This process flow is referred to as bottom-up formation of a strained silicon layer. In this process flow embodiment, a bubble recess (not pictured) has been formed in a substrate 410, below a protective layer (not pictured) that is formed upon an oxide film (not pictured). Positioning of the bubble recess is controlled by a spacer (not pictured), which is formed according to processing embodiments set forth in this disclosure. An MFOX 436 or an FMFOX 436 is formed according to processing embodiments set forth in this disclosure, which simultaneously forms an active area precursor 433.

FIG. 4B is a side cross-section of the structure depicted in FIG. 4A after further processing. After the isotropic etch forms the bubble recess, an oxidation process is carried out to vertically isolate the active area precursor 433 by the formation of the MFOX 436 or the FMFOX 436. In one embodiment, the oxidation process is carried out with the protective layer and the spacers in place, followed by a nitride etch to remove them.

Similar to the bubble recess 132 (FIG. 1E), the size and shape of the MFOX 436 or the FMFOX 436 is also depicted in arbitrary shape and size. The actual size and shape will be influenced by etch and oxidation conditions according to a process integration. One characteristic of forming the MFOX 436 or the FMFOX 436, requires an oxidation process that leaves the active area precursor 433 firmly attached to the substrate 410 through the MFOX 436 or the FMFOX 436. By this process, oxidation is sufficient to vertically isolate the active area precursor 433 from the substrate 410 to create an SOI structure. Processing conditions can be ascertained by reading this disclosure, and by routine experimentation.

In this process flow embodiment, the active area precursor 433 is used to grow a relaxed layer 418 and a strained silicon layer 416. In one process embodiment, a CVD process is used. In one process embodiment, an ultra-high vacuum CVD (UHV CVD) process is used.

FIG. 4B depicts the formation of an epitaxial relaxed layer 418, an epitaxial strained silicon layer 416, and a polycrystalline zone 417 that is doped similarly to the respective epitaxial relaxed layer 418 and the epitaxial strained silicon layer 416. The solid vertical arrows 415 represent epitaxial, bottom-up growth of the epitaxial relaxed layer 418 and the epitaxial strained silicon layer 416. The dashed vertical arrows 413 represent, bottom-up growth of the polycrystalline zone 417.

FIG. 4C is a side cross-section of the structure depicted in FIG. 4B after further processing. An etch recipe is used that is selective to leaving the epitaxial and crystalline silicon in the strained silicon layer 416, the relaxed layer 418, and the substrate 410. The etch recipe removes the polycrystalline zone 417 (FIG. 4B), and leaves the SSOI active area 434 as depicted.

The oxidation process affects the integrity of the SSOI active area 434. For a 0.25-micron CD 438 process, the SSOI active area 434 has a height 440 in a range from about 0.1 microns to about 0.15 microns. Alternatively, for a 0.15-micron CD process, the SSOI active area 434 has a height 440 in a range from about 0.07 microns to about 0.12 microns.

According to an embodiment, the formation of the MFOX 436 or the FMFOX 436 is carried out under conditions to prevent destructive stresses in the newly formed SSOI active area 434. By reading this disclosure, one of ordinary skill in the art can conduct the minifield oxidation by routine experimentation without causing destructive stresses in the SSOI active area 434.

FIGS. 4D and 4E illustrate further processing according to an embodiment taken from the structure depicted in FIG. 4C by way of non-limiting example. The processing depicted in FIGS. 4D and 4E, however, is also applicable to the structures depicted in FIGS. 1F, 2B, and 3B.

The vertically and laterally isolated SSOI active areas 434, also referred to as Si/SiGe/SOI islands 434 according to one embodiment, are separated by the recess 422 that, in this embodiment, acts as a shallow trench isolation (STI) trench. According to an embodiment, the recess 422 is filled with a material such as oxide by a known process such as a high-density plasma (HDP) technique. In one embodiment, the substrate 410 is blanket HDP deposited with an oxide blanket 454 deposition, which blankets the substrate 410 and which partially fills the recess 422. Thereafter, the oxide blanket 454 is etched back to form a spacer 454. The spacer 454 and the oxide fill 456 form a shallow trench dielectric. Next, an oxide fill 456 is carried out, and etched back by a process that stops on a protective layer 412 such as a pad oxide layer 412 or even a polysilicon layer 412. Where the protective layer 412 is present as a polysilicon material, overetching of the oxide fill 456 may occur. The etchback is carried out according to process needs, such as by chemical-mechanical polishing (CMP), mechanical polishing (MP), chemical etchback, and others.

Another embodiment occurs where no protective layer 412 has remained during processing to this extent of the process. For example, where the protective layer 412 is a nitride material, it is removed simultaneously with the remnant of the nitride protective film if present.

As depicted in FIG. 4D, the material filling the recess 422 is etched or planarized so that the top surface 455 of the oxide spacer 454 and the oxide fill 456 is approximately even with the top surface of the pad oxide layer 412. Where a protective layer is present such as a polysilicon material, the remnant of the protective layer is stripped in a manner so as not to damage the remnant of the pad oxide layer 412. In one embodiment, the remnant of the pad oxide layer 412 is used as a gate oxide for the fabrication of active devices above the SSOI active area 434.

Total isolation between devices on the SSOI active area 434 can be as much as 0.65 microns (0.2 microns of the oxide spacer 454 and oxide fill 456, plus 0.25 microns of the SSOI active area 434, plus 0.2 microns of the oxide spacer 454 and oxide fill 456) for a given 0.25-micron lithography.

A portion of the structure depicted in FIG. 4D is also depicted in FIG. 4E as a storage device, wherein two dynamic random access (DRAM) memory cells are formed thereon. Active devices in the form of a digit line junction 458 and storage node junctions 460 and 462 are formed in the vertically isolated SSOI active area 434. A word line 464 overlays the SSOI active area 434. The storage node junctions 460 and 462 are in electrical contact with respective capacitors 466 and 468 through polysilicon plugs 470. The digit line junction 458 is in electrical contact with a polysilicon plug 472. The polysilicon plug 472 is a contact that touches the SSOI active area 434. The polysilicon plug 472 is in further contact with a digit line 474 through a metal plug 476.

The substrate 410 carrying a vertically and laterally isolated SSOI active area 434 provides a vehicle for the fabrication of a storage device such as a DRAM cell, or virtually any type of logic circuit that employs a MOSFET.

While the structure depicted in FIG. 4E illustrates one type of device that might be fabricated upon the workpiece of the substrate 410 and with the use of the SSOI active area 434, those of ordinary skill in the art will recognize the advantages of fabricating other types of devices according to various embodiments and their equivalents. In particular, active devices formed in the SSOI active area 434 will be substantially isolated from the bulk of the substrate 410.

The processes and structures that are achieve in the various embodiments are inventively applicable to a variety of devices and apparatuses. System embodiments may be made by process embodiments, or that include an embodiment or embodiments of the structure. For example, a chip package may contain an SSOI active area such as an active area set forth in this disclosure. In one embodiment, an array of SSOI active areas is included such as a line of sense amplifiers that use the active areas, or a 2-dimensional array of storage devices such as a DRAM array. In another embodiment, the SSOI active area is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, systems are made that include the SSOI active area. For example, a chip package may contain an SSOI active area such as one set forth in this disclosure. In another embodiment, the SSOI active area is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the SSOI active area is part of an electronic system. In another embodiment, the SSOI active area is fabricated with a floating gate. In another embodiment, the SSOI active area is fabricated with a floating gate that is part of a flash memory device that in turn is part of a chipset such as a basic input-output system (BIOS) for an electrical device.

Figure 5:
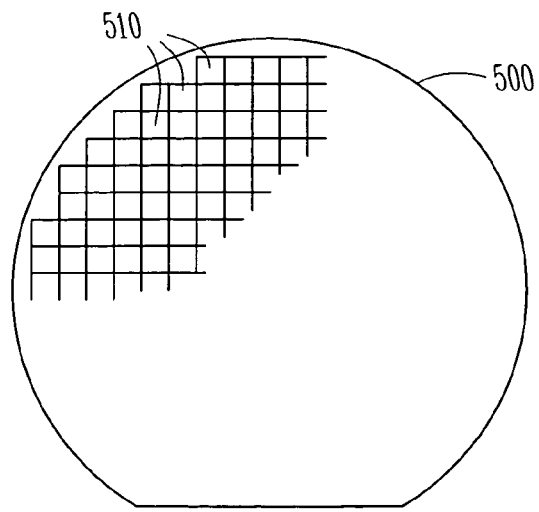
FIG. 5 is a top view of a wafer or substrate containing semiconductor dies in accordance with an embodiment.

FIG. 5 is a depiction of another embodiment. In this embodiment, systems are made that include the SSOI active area. With reference to FIG. 5, a semiconductor die 510 is produced from a silicon wafer 500 that contains at least one of the SSOI active areas 134, 234, 334, and 434, respectively, such as are depicted in FIGS. 1F, 2B, 3B, 4C, and 4E. A die 510 is an individual pattern, typically rectangular, on a substrate such as substrate 110, substrate 210, substrate 310, or substrate 410 that contains circuitry to perform a specific function. A semiconductor wafer 500 will typically contain a repeated pattern of such dies 510 containing the same functionality. Die 510 may further contain additional circuitry to extend to such complex devices as a monolithic processor with multiple functionality. Die 510 is typically packaged in a protective casing (not shown) with leads extending therefrom (not shown) providing access to the circuitry of the die 510 for unilateral or bilateral communication and control. In one embodiment, die 510 is incased in a host such as a chip package (not shown) such as a chip-scale package (CSP).

Figure 6:
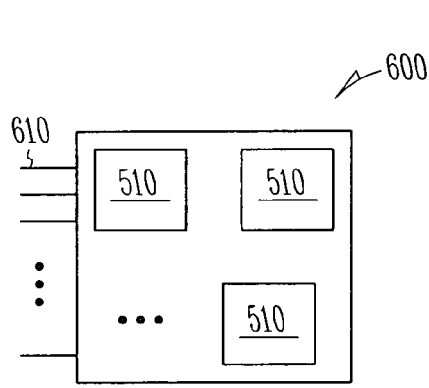
FIG. 6 is a block diagram of a circuit module in accordance with an embodiment.

FIG. 6 is a depiction of another embodiment. As shown in FIG. 6, two or more dies 510 at least one of which contains at least one of the SSOI active areas 134, 234, 334, and 434, respectively, such as are depicted in FIGS. 1F, 2B, 3B, 4C, and 4E, in accordance with various embodiments is combined, with or without a protective casing, into a host such as a circuit module 600 to enhance or extend the functionality of an individual die 510. Circuit module 600 may be a combination of dies 510 representing a variety of functions, or a combination of dies 510 containing the same functionality. Some examples of a circuit module 600 include memory modules, device drivers, power modules, communication modems, processor modules and application-specific modules and can include multi-layer, multi-chip modules. In one embodiment, the circuit module 600 is a sub-component of a variety of electronic systems, such as a clock, a television, a cell phone, a personal computer, an automobile, an industrial control system, an aircraft, a hand-held, and others. In one embodiment, the circuit module 600 has a variety of leads 610 extending therefrom providing unilateral or bilateral communication and control. In another embodiment, circuit module 600 has a storage device such as is depicted in FIG. 4E.

Figure 7:
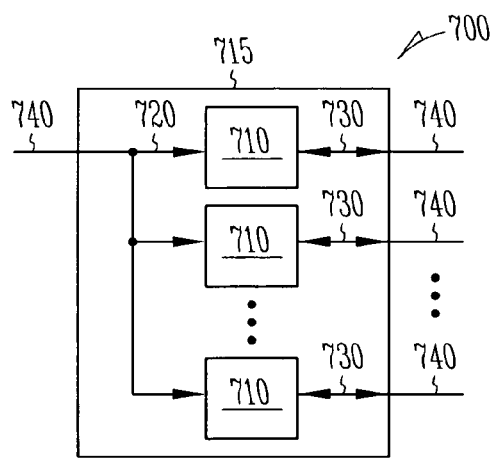
FIG. 7 is a block diagram of a memory module in accordance with an embodiment.

FIG. 7 is a depiction of another embodiment. FIG. 7 shows one embodiment of a circuit module as memory module 700 containing a structure for the inventive SSOI active area such as are depicted in FIGS. 1F, 2B, 3B, and 4C, or the storage device as is depicted in FIG. 4E. Memory module 700 is a host for a configuration that generally depicts a Single In-line Memory Module (SIMM) or Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate I/O signals. Memory module 700 contains multiple memory devices 710 contained on support 715, the number depending upon the desired bus width and the desire for parity. Memory module 700 may contain memory devices 710 on both sides of support 715. Memory module 700 accepts a command signal from an external controller (not shown) on a command link 720 and provides for data input and data output on data links 730. The command link 720 and data links 730 are connected to leads 740 extending from the support 715. Leads 740 are shown for conceptual purposes and are not limited to the positions shown in FIG. 7.

Figure 8:
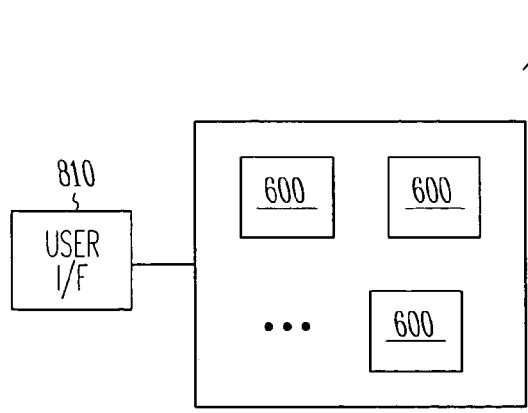
FIG. 8 is a block diagram of an electronic system in accordance with another embodiment the present invention.

FIG. 8 shows another host type such as an electronic system 800 containing one or more circuit modules 600 as described above containing at least one of the SSOI active areas or data storage devices that contain such. Electronic system 800 generally contains a user interface 810. User interface 810 provides a user of the electronic system 800 with some form of control or observation of the results of the electronic system 800. Some examples of user interface 810 include the keyboard, pointing device, monitor and printer of a personal computer; the tuning dial, display and speakers of a radio; the ignition switch of gas pedal of an automobile; and the card reader, keypad, display and currency dispenser of an automated teller machine. In one embodiment, the user interface 810 further describes access ports provided to electronic system 800. Access ports are used to connect an electronic system to the more tangible user interface components previously exemplified. One or more of the circuit modules 600 may be a processor providing some form of manipulation, control or direction of inputs from or outputs to user interface 810, or of other information either preprogrammed into, or otherwise provided to, electronic system 800. As will be apparent from the lists of examples previously given, electronic system 800 will often contain certain mechanical components (not shown) in addition to the circuit modules 600 and user interface 810. It will be appreciated that the one or more circuit modules 600 in electronic system 800 can be replaced by a single integrated circuit. Furthermore, electronic system 800 may be a sub-component of a larger electronic system.

Figure 9:
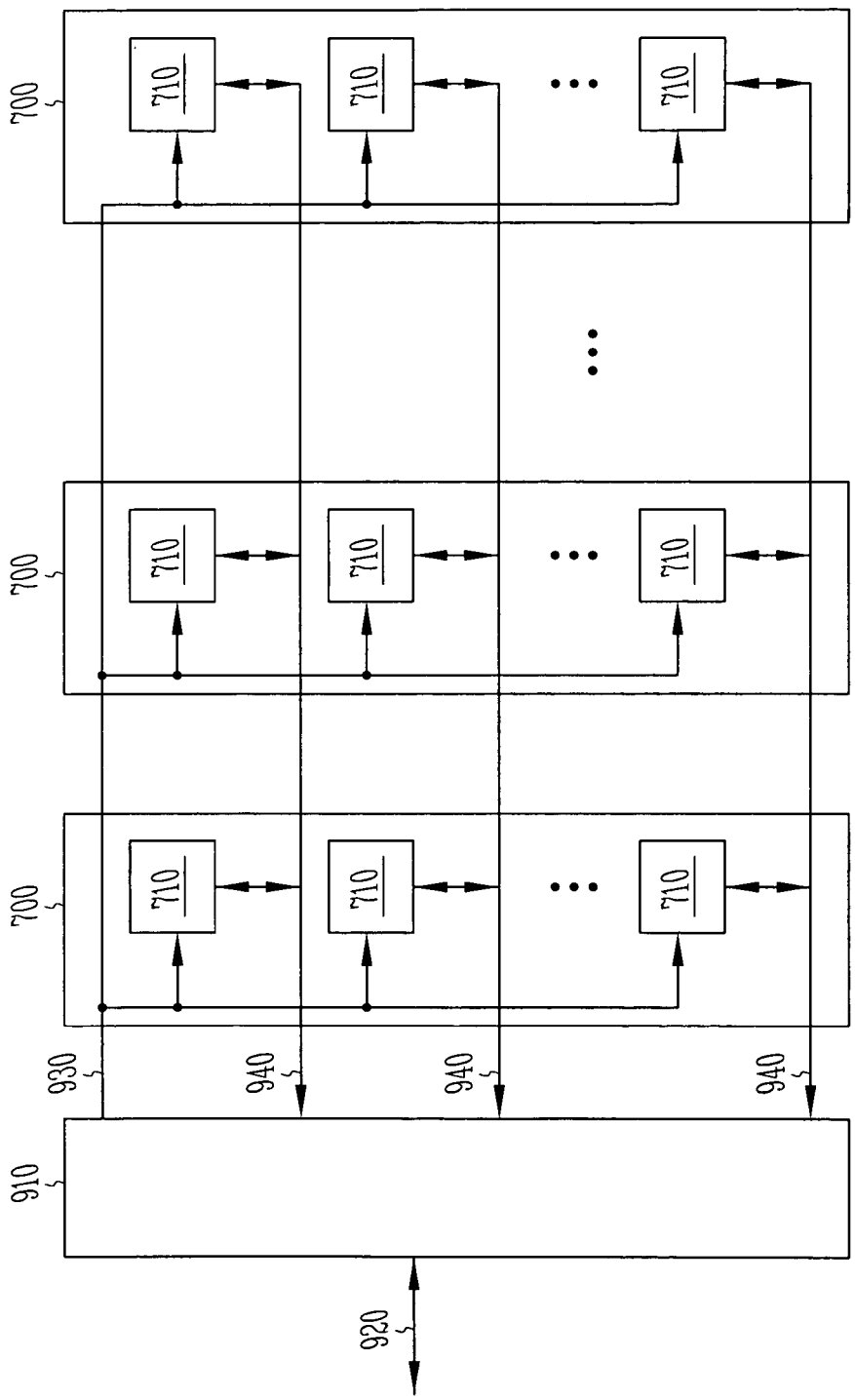
FIG. 9 is a block diagram of a memory system in accordance with an embodiment.

FIG. 9 shows one embodiment of an electrical device at a system level. The electronic system depicted in FIG. 9 is a memory system 900. Memory system 900 acts as a higher-level host that contains one or more memory modules 700 as described above including at least one of the SSOI active areas or the data storage device such as set forth herein in accordance with the present invention and a memory controller 910 that may also include circuitry for the inventive partially isolated structure or the data storage device. Memory controller 910 provides and controls a bidirectional interface between memory system 900 and an external system bus 920. Memory system 900 accepts a command signal from the external system bus 920 and relays it to the one or more memory modules 700 on a command link 930. Memory system 900 provides for data input and data output between the one or more memory modules 700 and external system bus 920 on data links 940.

Figure 10:
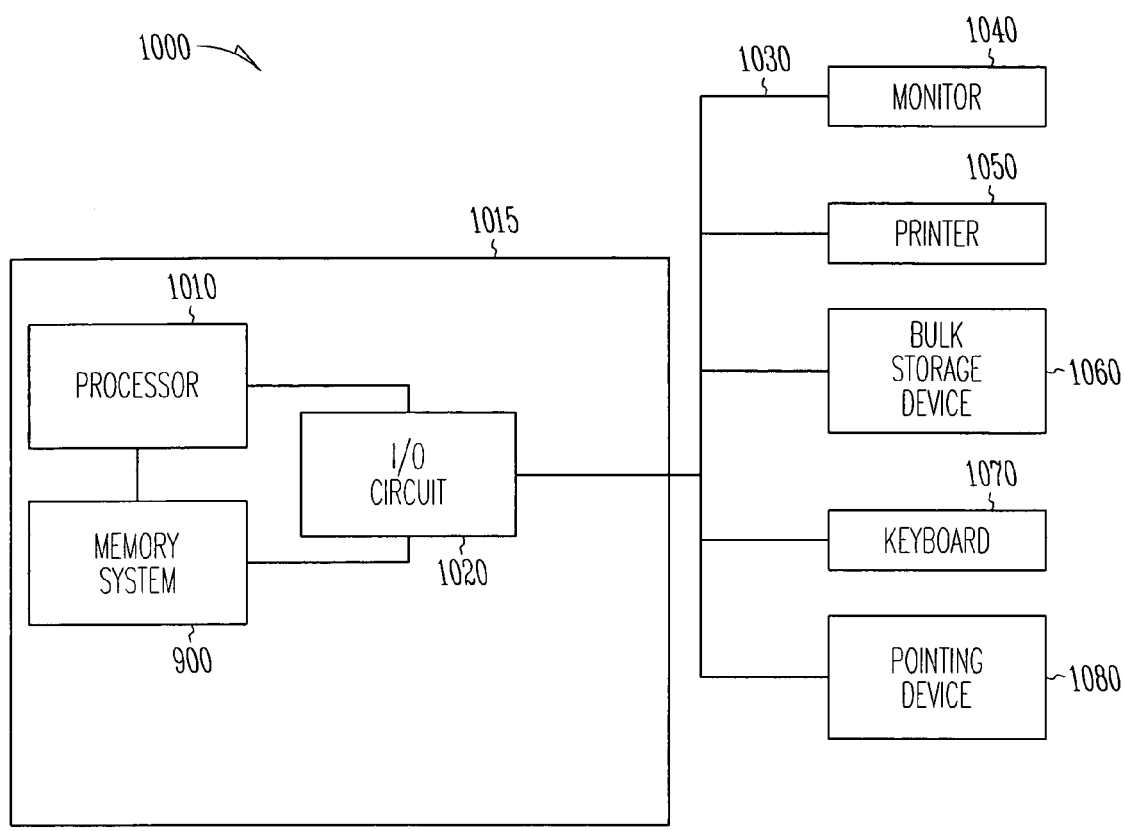
FIG. 10 is a block diagram of a computer system in accordance with an embodiment.

FIG. 10 shows a further embodiment of an electronic system as a computer system 1000. Computer system 1000 contains a processor 1010 and a memory system 900 housed in a computer unit 1015. Computer system 1000 is but one example of an electronic system containing another electronic system, i.e. memory system 900, as a sub-component. In one embodiment, the computer system 1000 contains an input/output (I/O) circuit 1020 that is coupled to the processor 1010 and the memory system 900. Computer system 1000 optionally contains user interface components that are coupled to the I/O circuit 1020. In accordance with the present invention a plurality partially isolated structures or data storage devices may each be coupled to one of a plurality of I/O pads or pins 1030 of the I/O circuit 1020. The I/O circuit 1020 may then be coupled a monitor 1040, a printer 1050, a bulk storage device 1060, a keyboard 1070 and a pointing device 1080. It will be appreciated that other components are often associated with computer system 1000 such as modems, device driver cards, additional storage devices, etc. It will further be appreciated that the processor 1010, memory system 900, I/O circuit 1020 and partially isolated structures or data storage devices of computer system 1000 can be incorporated on a single integrated circuit. Such single package processing units reduce the communication time between the processor 1010 and the memory system 1000.

CONCLUSION

Thus has been disclosed a strained silicon-on-insulator active area that can be an Si/SiGe/SOI island. A process of fabricating the strained silicon-on-insulator active area has also been disclosed that uses an etch that forms an undercutting bubble recess. An oxidation process completes vertical isolation of the strained silicon-on-insulator active area. Embodiments of the present invention relate to processes that facilitate the vertical isolation of the strained silicon-on-insulator active area and oxidation in the lateral or bubble recess.

A structure is also achieved that includes a faceted bubble recess in one embodiment. The faceted bubble recess acts to begin a vertical isolation of the strained silicon-on-insulator active area from the bulk of the substrate.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

While the present invention has been described in connection with a preferred embodiment thereof, those of ordinary skill in the art will recognize that many modifications and variations may be employed. For example, the sample dimensions and process parameters disclosed herein may be varied and are disclosed for the purpose of illustration and not limitation. The foregoing disclosure and the following claims are intended to cover all such modifications and variations.

What is claimed is:

1. An article comprising:
    a substrate;
    a relaxed semiconductive silicon compound layer disposed above and grown in direct contact with the substrate;
    a strained silicon layer disposed above and grown in direct contact with the relaxed semiconductive silicon compound layer;
    wherein the strained silicon layer is laterally isolated by a shallow trench isolation, and wherein the strained silicon layer is vertically isolated by a thermal oxide disposed below and grown in direct contact with both the relaxed semiconductive silicon compound layer and the substrate.

2. The article according to claim 1, wherein the relaxed semiconductive silicon compound layer includes a SiGe compound.

3. The article according to claim 1, above the strained silicon layer, further including:
    a storage device.

4. The article of claim 1, wherein the thermal oxide comprises a mini field oxide.

5. The article of claim 1, wherein the thermal oxide comprises a high pressure oxide.

6. The article of claim 1, wherein the thermal oxide comprises a flattened field oxide.

7. The article of claim 1, wherein the thermal oxide comprises facet faces at an oxide to substrate interface.

* * * * *

UNITED STATES PATENT AND TRADEMARK OFFICE
CERTIFICATE OF CORRECTION

PATENT NO.        : 7,262,428 B2                                             Page 1 of 1
APPLICATION NO. : 10/979994
DATED             : August 28, 2007
INVENTOR(S)       : Forbes It is certified that error appears in the above-identified patent and that said Letters Patent is hereby corrected as shown below:

On the Title Page, Item (54), in "Title", line 1, delete "SI/SIGE/SOI" and insert -- Si/SiGe/SOI --, therefor.

In column 1, line 1, delete "SI/SIGE/SOI" and insert -- Si/SiGe/SOI --, therefor.

Signed and Sealed this

Thirteenth Day of November, 2007

JON W. DUDAS
*Director of the United States Patent and Trademark Office*